US012757569B2

(12) United States Patent
Wang

(10) Patent No.: US 12,757,569 B2
(45) Date of Patent: Oct. 6, 2026

(54) LIGHT-EMITTING DEVICE AND METHOD OF MANUFACTURING THE SAME, DISPLAY PANEL AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Haowei Wang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 487 days.

(21) Appl. No.: 18/260,938

(22) PCT Filed: Jun. 30, 2022

(86) PCT No.: PCT/CN2022/103128
§ 371 (c)(1),
(2) Date: Jul. 11, 2023

(87) PCT Pub. No.: WO2024/000517
PCT Pub. Date: Jan. 4, 2024

(65) Prior Publication Data
US 2024/0414935 A1 Dec. 12, 2024

(51) Int. Cl.
*H10K 50/15* (2023.01)
*B82Y 20/00* (2011.01)
(Continued)

(52) U.S. Cl.
CPC ......... *H10K 50/156* (2023.02); *H10K 50/115* (2023.02); *H10K 71/12* (2023.02);
(Continued)

(58) Field of Classification Search
CPC .................................................... H10K 50/156
See application file for complete search history.

(56) References Cited

U.S. PATENT DOCUMENTS

2013/0313535 A1 11/2013 Heo et al.
2017/0373266 A1* 12/2017 Xu ......................... H10K 50/16
(Continued)

FOREIGN PATENT DOCUMENTS

CN 102088062 A 6/2011
CN 103426902 A 12/2013
(Continued)

OTHER PUBLICATIONS

Ambrozevich et al., Hole mobility and trapping in PVK films doped with CdSe/CdS and CdSe quantum dots, Jan. 2008, ResearchGate, https://www.researchgate.net/publication/227267326_Hole_mobility_and_trapping_in_PVK_films_doped_with_CdSeCdS_and_CdSe_quantum_dots (Year: 2008).*
(Continued)

*Primary Examiner* — Jeff W Natalini
*Assistant Examiner* — Jacob Raul Marin
(74) *Attorney, Agent, or Firm* — XSENSUS LLP

(57) ABSTRACT

A light-emitting device is provided. The light-emitting device includes a first electrode, a second electrode, a quantum dot light-emitting layer located between the first electrode and the second electrode, and a hole transporting doped layer. The hole transporting doped layer is located between the quantum dot light-emitting layer and the second electrode. The hole transporting doped layer includes a mixture of at least two hole transporting materials, and highest occupied molecular orbital energy levels of the at least two hole transporting materials are different.

18 Claims, 8 Drawing Sheets

(51) Int. Cl.

| | |
|---|---|
| ***H10K 50/115*** | (2023.01) |
| ***H10K 71/12*** | (2023.01) |
| ***H10K 85/60*** | (2023.01) |
| *H10K 101/40* | (2023.01) |
| *H10K 102/00* | (2023.01) |

(52) U.S. Cl.
CPC ......... *H10K 85/633* (2023.02); *H10K 85/636* (2023.02); *H10K 85/654* (2023.02); *B82Y 20/00* (2013.01); *H10K 85/626* (2023.02); *H10K 85/6572* (2023.02); *H10K 2101/40* (2023.02); *H10K 2102/351* (2023.02)

(56) References Cited

U.S. PATENT DOCUMENTS

| | | | | |
|---|---|---|---|---|
| 2018/0076394 | A1* | 3/2018 | Kawakami ........... | H10K 85/653 |
| 2019/0280230 | A1* | 9/2019 | Seo ...................... | H10K 50/115 |
| 2020/0161577 | A1* | 5/2020 | Kang ................... | H10K 50/115 |
| 2021/0098729 | A1 | 4/2021 | Ueta et al. | |

FOREIGN PATENT DOCUMENTS

| | | | | |
|---|---|---|---|---|
| CN | 105244451 A | | 1/2016 | |
| CN | 105845838 B | * | 12/2017 | ........... H10K 50/156 |
| CN | 110635058 A | | 12/2019 | |
| CN | 113437231 A | | 9/2021 | |
| CN | 113809255 A | | 12/2021 | |

OTHER PUBLICATIONS

Wang et al., First-principles study of transport in WO_{3}, Jan. 2020, APS physics, https://link.aps.org/accepted/10.1103/Phys RevB.101.045116 (Year: 2020).*

Chiu et al., Improvement in hole transporting ability and device performance of quantum dot light emitting diodes, Nov. 2019, Royal Society of Chemistry, https://pubs.rsc.org/en/content/articlehtml/2020/na/c9na00618d (Year: 2019).*

Zhu et al., Intrinsic Defects and H Doping in WO3, Jan. 2017 (Year: 2017).* https://www.chemicalbook.com/ChemicalProductProperty_EN_CB1718034.htm#References (Year: 2016).* https://www.chemicalbook.com/ChemicalProductProperty_EN_CB3288478.htm (Year: 2016).*

Hong et al., Effect of aggregation behavior and phenolic hydroxyl group content on the performance of lignosulfonate doped PEDOT as a hole extraction layer in polymer solar cells, 2015, RSC Advances, p. 6 (Year: 2015).*

Barra Mario, Electrical transport properties characterization of PVK (poly N-vinylcarbazole) for electroluminescent devices applications, 2007, Academia, p. 2, www.academia.edu/17509007/Electrical_transport_properties_characterization_of_PVK_poly_N_vinylcarbazole_for_electroluminescent_devices_a (Year: 2007).*

Zhu et al., Field-effect mobilities of polyhedral oligomeric silsesquioxanes anchored semiconducting polymers, 2004, Science Direct, p. 3, https://www.sciencedirect.com/science/article/pii/S0169433203009395 (Year: 2004).*

Zhang et al., Indium tin oxide films prepared by radio frequency magnetron sputtering method at a low processing temperature, 2000, p. 4 (Year: 2000).*

* cited by examiner

LIGHT-EMITTING DEVICE AND METHOD OF MANUFACTURING THE SAME, DISPLAY PANEL AND DISPLAY APPARATUS

CROSS-REFERENCE TO RELATED APPLICATION

The present application is a national phase entry under 35 USC 371 of International Patent Application No. PCT/CN2022/103128, filed on Jun. 30, 2022, which is incorporated herein by reference in its entirety.

TECHNICAL FIELD

The present disclosure relates to the fields of lighting and display technologies, and in particular, to a light-emitting device and a method of manufacturing the same, a display panel and a display apparatus.

BACKGROUND

Quantum dot light emitting diode (QLED) devices have attracted much attention in the field of display due to their advantages of high color gamut, self-luminescence, low starting voltage, fast response speed and the like. A basic working principle of a QLED device is that electrons and holes are respectively injected into two sides of a quantum dot light-emitting layer, and the electrons and the holes recombine in the quantum dot light-emitting layer to form excitons by which the QLED device eventually emits light.

SUMMARY

In an aspect, a light-emitting device is provided. The light-emitting device includes a first electrode, a second electrode, a quantum dot light-emitting layer located between the first electrode and the second electrode, and a hole transporting doped layer. The hole transporting doped layer is located between the quantum dot light-emitting layer and the second electrode. The hole transporting doped layer includes a mixture of at least two hole transporting materials, and highest occupied molecular orbital energy levels of the at least two hole transporting materials are different.

In some embodiments, mobilities of the at least two hole transporting materials are different; of any two hole transporting materials, a mobility of a hole transporting material of which a highest occupied molecular orbital energy level is low is less than a mobility of a hole transporting material of which a highest occupied molecular orbital energy level is high.

In some embodiments, the at least two hole transporting materials include a first hole transporting material and a second hole transporting material, and a highest occupied molecular orbital energy level of the first hole transporting material is less than a highest occupied molecular orbital energy level of the second hole transporting material. In the hole transporting doped layer, a mass ratio of the first hole transporting material to the second hole transporting material is in a range from 1:5 to 5:1.

In some embodiments, in the hole transporting doped layer, the mass ratio of the first hole transporting material to the second hole transporting material is 2:1.

In some embodiments, a thickness of the hole transporting doped layer is 0.66 to 5 times a thickness of the quantum dot light-emitting layer.

In some embodiments, a thickness of the hole transporting doped layer is 2.3 times a thickness of the quantum dot light-emitting layer.

In some embodiments, a thickness of the hole transporting doped layer is in a range from 20 nm to 50 nm.

In some embodiments, the light-emitting device further includes a first hole transporting layer. The first hole transporting layer is located between the quantum dot light-emitting layer and the hole transporting doped layer; a highest occupied molecular orbital energy level of the first hole transporting layer is less than or equal to the highest occupied molecular orbital energy level of the first hole transporting material, and is greater than a highest occupied molecular orbital energy level of the quantum dot light-emitting layer.

In some embodiments, a mobility of the first hole transporting layer is less than or equal to a mobility of the first hole transporting material, and is greater than a mobility of the quantum dot light-emitting layer.

In some embodiments, the first hole transporting layer includes the first hole transporting material.

In some embodiments, in the hole transporting doped layer, the mass ratio of the first hole transporting material to the second hole transporting material is 2:1.

In some embodiments, a thickness of the hole transporting doped layer is 0.33 to 5 times a thickness of the quantum dot light-emitting layer; a thickness of the first hole transporting layer is 0.06 to 2 times the thickness of the hole transporting doped layer.

In some embodiments, a thickness of the first hole transporting layer is one third of a thickness of the hole transporting doped layer.

In some embodiments, a thickness of the hole transporting doped layer is in a range from 10 nm to 50 nm; a thickness of the first hole transporting layer is in a range from 3 nm to 20 nm.

In some embodiments, the light-emitting device further includes a second hole transporting layer. The second hole transporting layer is located between the hole transporting doped layer and the second electrode; a highest occupied molecular orbital energy level of the second hole transporting layer is less than a highest occupied molecular orbital energy level of the second electrode, and is greater than or equal to the highest occupied molecular orbital energy level of the second hole transporting material.

In some embodiments, a mobility of the second hole transporting layer is less than a mobility of the second electrode, and is greater than or equal to a mobility of the second hole transporting material.

In some embodiments, the second hole transporting layer includes the second hole transporting material.

In some embodiments, in the hole transporting doped layer, the mass ratio of the first hole transporting material to the second hole transporting material is 1:1.

In some embodiments, a thickness of the hole transporting doped layer is 0.1 to 2 times a thickness of the quantum dot light-emitting layer; a thickness of the second hole transporting layer is 0.5 to 16.66 times the thickness of the hole transporting doped layer.

In some embodiments, a thickness of the second hole transporting layer is 3 times a thickness of the hole transporting doped layer.

In some embodiments, a thickness of the hole transporting doped layer is in a range from 3 nm to 20 nm; a thickness of the second hole transporting layer is in a range from 10 nm to 50 nm.

In some embodiments, the light-emitting device further includes a first hole transporting layer and a second hole transporting layer. The first hole transporting layer is located between the quantum dot light-emitting layer and the hole transporting doped layer; a highest occupied molecular orbital energy level of the first hole transporting layer is less than or equal to the highest occupied molecular orbital energy level of the first hole transporting material, and is greater than a highest occupied molecular orbital energy level of the quantum dot light-emitting layer. The second hole transporting layer is located between the hole transporting doped layer and the second electrode; a highest occupied molecular orbital energy level of the second hole transporting layer is less than a highest occupied molecular orbital energy level of the second electrode, and is greater than or equal to the highest occupied molecular orbital energy level of the second hole transporting material.

In some embodiments, a mobility of the first hole transporting layer is less than or equal to a mobility of the first hole transporting material, and is greater than a mobility of the quantum dot light-emitting layer; a mobility of the second hole transporting layer is less than a mobility of the second electrode, and is greater than or equal to a mobility of the second hole transporting material.

In some embodiments, the first hole transporting layer includes the first hole transporting material; the second hole transporting layer includes the second hole transporting material.

In some embodiments, in the hole transporting doped layer, the mass ratio of the first hole transporting material to the second hole transporting material is 1:1.

In some embodiments, a thickness of the hole transporting doped layer is 0.1 to 2 times a thickness of the quantum dot light-emitting layer; a thickness of the first hole transporting layer is 0.15 to 6.67 times the thickness of the hole transporting doped layer; a thickness of the second hole transporting layer is 0.5 to 16.67 times the thickness of the hole transporting doped layer.

In some embodiments, a thickness of the first hole transporting layer is 1 time a thickness of the hole transporting doped layer; a thickness of the second hole transporting layer is 6 times the thickness of the hole transporting doped layer.

In some embodiments, a thickness of the hole transporting doped layer is in a range from 3 nm to 20 nm; a thickness of the first hole transporting layer is in a range from 3 nm to 20 nm; a thickness of the second hole transporting layer is in a range from 10 nm to 50 nm.

In some embodiments, the hole transporting doped layer includes a plurality of doped sub-layers that are arranged in a stack; of any two adjacent doped sub-layers, a mass ratio of a first hole transporting material to a second hole transporting material in a doped sub-layer proximate to the quantum dot light-emitting layer is greater than a mass ratio of a first hole transporting material to a second hole transporting material in a doped sub-layer away from the quantum dot light-emitting layer.

In some embodiments, the highest occupied molecular orbital energy level of the first hole transporting material is 0.88 to 1.02 times a highest occupied molecular orbital energy level of the quantum dot light-emitting layer; the highest occupied molecular orbital energy level of the second hole transporting material is 0.82 to 0.97 times the highest occupied molecular orbital energy level of the quantum dot light-emitting layer.

In some embodiments, the highest occupied molecular orbital energy level of the first hole transporting material is in a range from −6.3 eV to −5.9 eV; the highest occupied molecular orbital energy level of the second hole transporting material is in a range from −6 eV to −5.5 eV.

In some embodiments, a mobility of the first hole transporting material is 1 to $10^3$ times a mobility of the quantum dot light-emitting layer; a mobility of the second hole transporting material is $10^2$ to $10^4$ times the mobility of the quantum dot light-emitting layer.

In some embodiments, a mobility of the first hole transporting material is in a range from $10^{-5}$ $cm^2V^{-1}s^{-1}$ to $10^{-3}$ $cm^2V^{-1}s^{-1}$; a mobility of the second hole transporting material is in a range from $10^{-3}$ $cm^2V^{-1}s^{-1}$ to $10^{-2}$ $cm^2V^{-1}s^{-1}$.

In some embodiments, the at least two hole transporting materials include at least two of following materials: 4,4'-bis(carbazole-9-yl)biphenyl, 1,3-bis(carbazol-9-yl)benzene, 2,6-bis(3-(9H-carbazol-9-yl)phenyl)pyridine, 4,4',4"-tris(carbazol-9-yl)triphenylamine, 1,1-bis[4-[N, N'-di(p-tolyl)amino]phenyl]cyclohexane or N,N'-bis(naphthalen-1-yl)-N, N'-bis(phenyl)benzidine.

In some embodiments, the light-emitting device further includes a hole injection layer and an electron transporting layer. The hole injection layer is located between the second electrode and the hole transporting doped layer. The electron transporting layer is located between the first electrode and the quantum dot light-emitting layer.

In another aspect, a display panel is provided. The display panel includes a substrate, and a plurality of light-emitting devices each as described in any one of the above embodiments. The plurality of light-emitting devices are disposed on a side of the substrate.

In yet another aspect, a display apparatus is provided. The display apparatus includes the display panel as described in any one of the above embodiments.

In yet another aspect, a method of manufacturing a light-emitting device is provided. The method of manufacturing the light-emitting device includes: forming a quantum dot light-emitting layer on a side of a first electrode; forming a hole transporting doped layer on a side of the quantum dot light-emitting layer away from the first electrode, the hole transporting doped layer including a mixture of at least two hole transporting materials, highest occupied molecular orbital energy levels of the at least two hole transporting materials being different; and forming a second electrode on a side of the hole transporting doped layer away from the quantum dot light-emitting layer.

In some embodiments, the at least two hole transporting materials include a first hole transporting material and a second hole transporting material, and a highest occupied molecular orbital energy level of the first hole transporting material is less than a highest occupied molecular orbital energy level of the second hole transporting material. In a step of forming the hole transporting doped layer on the side of the quantum dot light-emitting layer away from the first electrode, the first hole transporting material and the second hole transporting material are simultaneously deposited on the side of the first electrode by a dual-source co-evaporation method, so as to form the hole transporting doped layer.

In some embodiments, after a step of forming the quantum dot light-emitting layer on the side of the first electrode, the method further includes forming a first hole transporting layer on the side of the quantum dot light-emitting layer away from the first electrode. A step of forming the hole transporting doped layer on the side of the quantum dot light-emitting layer away from the first electrode includes forming the hole transporting doped layer on a side of the first hole transporting layer away from the first electrode. In some embodiments, after a step of forming the hole transporting doped layer on the side of the quantum dot light-emitting layer away from the first electrode, the method further includes forming a second hole transporting layer on the side of the hole transporting doped layer away from the first electrode. A step of forming the second electrode on the side of the hole transporting doped layer away from the quantum dot light-emitting layer includes forming the second electrode on a side of the second hole transporting layer away from the hole transporting doped layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
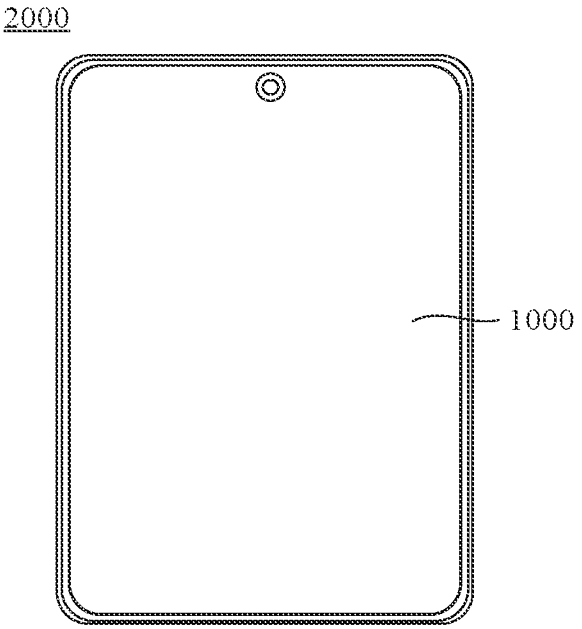
FIG. 1 is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

The phrase "a difference between A and B" refers to a difference between a greater one of A and B and a less one of A and B.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

A quantum dot (QD), as a new luminescent material, has advantages of high purity of light, high luminescent quantum efficiency, adjustable luminescent color, long service life and the like, and has become a research hotspot of new light emitting diode (LED) luminescent materials at present. Therefore, a quantum dot light emitting diode (QLED) in which a quantum dot material serves as a light-emitting layer has become a main research direction of new display apparatuses at present.

A basic working principle of a QLED is that electrons and holes are respectively injected into two sides of a quantum dot light-emitting layer, and the electrons and the holes recombine in the quantum dot light-emitting layer to form excitons by which the QLED eventually emits light.

However, a fact that rates of respectively injecting the electrons and the holes into the quantum dot light-emitting layer are unbalanced may cause the quantum dot light-emitting layer to be in a charged state, so that the electrons and the holes are recombined subsequently in a manner of non-radiative recombination (auger recombination). As a result, a luminous efficiency of the QLED is relatively low.

In the relate art, an efficiency of injecting the electrons is great than an efficiency of injecting the holes, which causes the rates of respectively injecting the electrons and the holes into the quantum dot light-emitting layer to be unbalanced, so that the luminous efficiency of the QLED is relatively low.

FIG. 1 is a structural diagram of a display apparatus 2000, in accordance with some embodiments.

Referring to FIG. 1, some embodiments of the present disclosure provide a display apparatus 2000, and the display apparatus 2000 includes a display panel 1000.

The display apparatus 2000 may be a quantum dot organic light emitting diode display apparatus, and the display panel 1000 may be a quantum dot organic light emitting diode display panel correspondingly.

Figure 2:
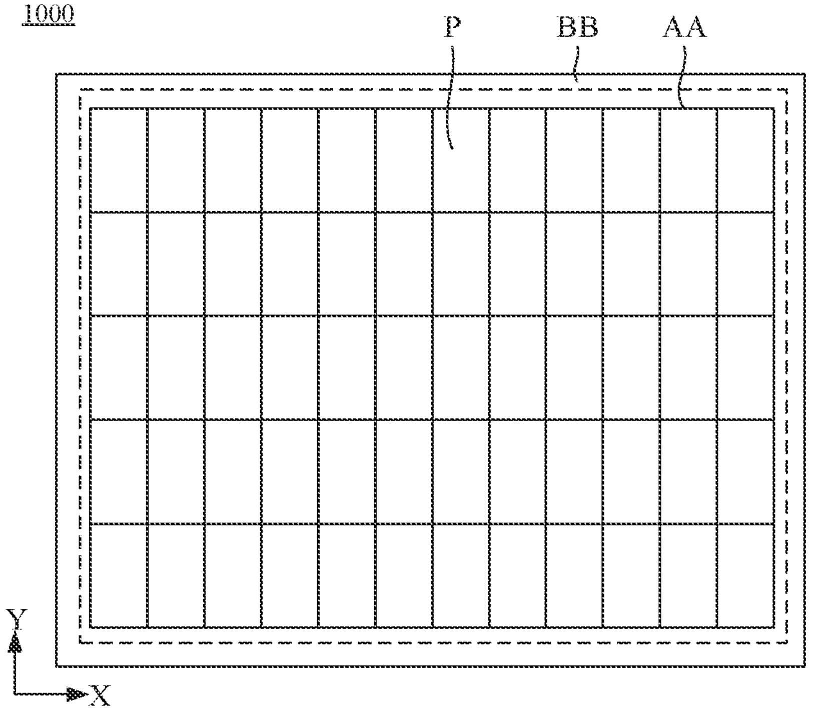
FIG. 2 is a structural diagram of a display panel, in accordance with some embodiments.

FIG. 2 is a structural diagram of a display panel 1000, in accordance with some embodiments.

Referring to FIG. 2, some embodiments of the present disclosure provide a display panel 1000, and the display panel 1000 has a display area AA and a peripheral area BB that is located on at least one side of the display area AA. In some examples, the peripheral area BB is disposed around the display area AA.

The display area AA is provided with sub-pixels P of a plurality of colors therein. The sub-pixels of the plurality of colors include at least sub-pixels of a first color, sub-pixels of a second color and sub-pixels of a third color, and the first color, the second color and the third color are three primary colors (e.g., a red color, a green color and a blue color). A region of any sub-pixel P may be defined by a pixel definition layer.

For convenience of description, the embodiments of the present disclosure are described by taking an example where the sub-pixels P are arranged in a matrix. In this case, sub-pixels P arranged in a line in a first direction X are referred to as a same row of sub-pixels, and sub-pixels P arranged in a line in a second direction Y are referred to as a same column of sub-pixels.

Figure 3:
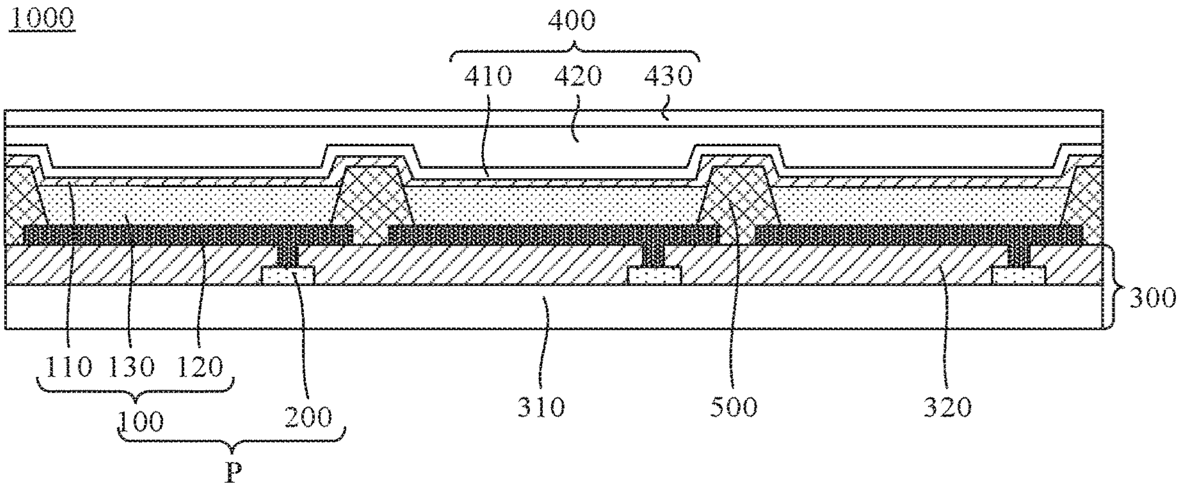
FIG. 3 is a sectional view of a display panel, in accordance with some embodiments.

FIG. 3 is a sectional view of the display panel 1000, in accordance with some embodiments.

Referring to FIG. 3, as for a single sub-pixel P, the single sub-pixel P includes a light-emitting device 100 and a pixel driving circuit 200. The pixel driving circuit 200 is generally constituted by electronic devices such as thin film transistor(s) TFT and capacitor(s) (not shown in the figure). For example, the pixel driving circuit 200 may be a pixel driving circuit of a structure of 2T1C constituted by two thin film transistors (a switching thin film transistor TFT and a driving thin film transistor TFT) and a capacitor. Of course, the pixel driving circuit 200 may be a pixel driving circuit 200 constituted by more than two thin film transistors (a plurality of switching thin film transistors TFT and a driving thin film transistor TFT) and at least one capacitor. Regardless of the structure of the pixel driving circuit 200, the driving thin film transistor TFT must be included. The driving thin film transistor TFT may be connected to an anode of the light-emitting device 100.

The display panel 1000 includes a plurality of film layers. The plurality of film layers in the display panel 1000 will be described below.

Referring to FIG. 3, the display panel 1000 includes a driving substrate 300, light-emitting devices 100 and an encapsulation layer 400 that are arranged in sequence.

The driving substrate 300 includes a substrate 310, and pixel driving circuits 200 and an insulating layer 320 that are located on a side of the substrate 310.

A light-emitting device 100 includes a first electrode 110, a second electrode 120 and a quantum dot light-emitting layer 130 that is located between the first electrode 110 and the second electrode 120.

The first electrode 110 may be a cathode, and in this case, the first electrode 110 may provide electrons. The second electrode 120 is an anode, and in this case, the second electrode 120 may provide holes.

In some examples, the first electrode 110 may be located on a side of the second electrode 120 away from the substrate 310.

In some other examples, the first electrode 110 may be located between the second electrode 120 and the substrate 310.

The encapsulation layer 400 includes a first encapsulation inorganic film 410, an encapsulation organic film 420 and a second encapsulation inorganic film 430. In some examples, each of the first encapsulation inorganic film 410 and the second encapsulation inorganic film 430 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SION), lithium fluoride or the like. In some examples, the encapsulation organic film 420 may be made of acrylic resin, methacrylic resin, polyisoprene, vinyl ester resin, epoxy resin, urethane resin, cellulose resin or the like. The laminated structure of the encapsulation layer 400 may vary.

In addition, the display panel 1000 further includes a pixel definition layer 500. The pixel definition layer 500 is located on a side of the insulating layer 320 away from the substrate 310, the pixel definition layer 500 is provided with a plurality of pixel openings formed therein, and the quantum dot light-emitting layer 130 may be disposed in a respective pixel opening.

The light-emitting device 100 will be described below.

Figure 4:
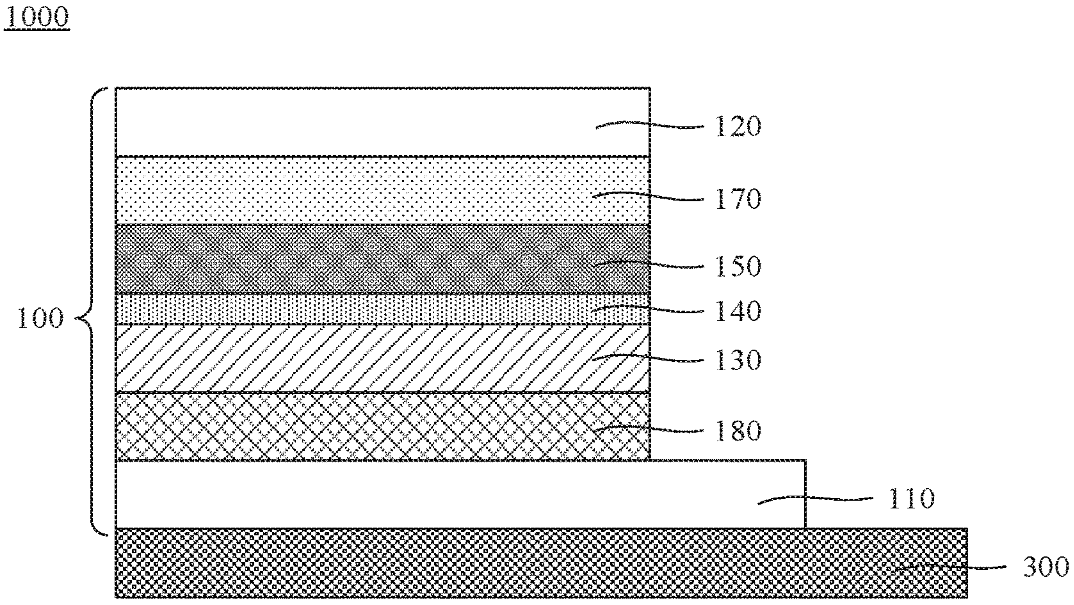
FIG. 4 is a structural diagram of a display panel, in accordance with an implementation.

FIG. 4 is a structural diagram of a display panel 1000, in accordance with an implementation.

Referring to FIG. 4, in an implementation, a light-emitting device 100 is provided. The light-emitting device 100 includes a first electrode 110, a second electrode 120 and a quantum dot light-emitting layer 130 that is located between the first electrode 110 and the second electrode 120.

In some examples, the first electrode 110 may be a cathode, the cathode may be conductive glass, and the conductive glass may include a material such as indium tin oxide (ITO) or fluorine-doped tin oxide (FTO).

In some examples, a thickness of the first electrode 110 is in a range from 90 nm to 150 nm, inclusive. For example, the thickness of the first electrode 110 is 120 nm.

In some examples, the second electrode 120 may be an anode, and the anode may include a material such as aluminum (Al), silver (Ag) or indium zinc oxide (IZO).

In some examples, a thickness of the second electrode 120 is in a range from 80 nm to 150 nm, inclusive. For example, the thickness of the second electrode 120 is 120 nm.

For example, the quantum dot light-emitting layer 130 includes cadmium sulfide (CdS), cadmium selenide (CdSe), cadmium telluride (CdTe), zinc selenide (ZnSe), indium phosphide (InP), lead sulfide (PbS), copper indium sulfide (CulnSz), zinc oxide (ZnO), cesium lead chloride ($CsPbCl_3$), cesium lead tribromide (CsPbBrs), cesium lead triiodide (CsPbl3), CdS/zinc sulfide (ZnS), CdSe/ZnS, InP/ZnS, PbS/ZnS, indium arsenide (InAs), indium gallium arsenide (InGaAs), indium gallium nitride (InGaN), gallium nitride (GaN), zinc telluride (ZnTe), silicon (Si), germanium (Ge), carbon (C), and other nanoscale materials, e.g., nanorods and nanosheets, having the above compositions. For example, the quantum dot light-emitting layer 130 is a quantum dot containing no cadmium.

In an implementation, referring to FIG. 4, the light-emitting device 100 further includes a first hole transporting layer 140 and a second hole transporting layer 150. The first hole transporting layer 140 and the second hole transporting layer 150 are both located between the second electrode 120 and the quantum dot light-emitting layer 130, and the first hole transporting layer 140 is located between the second hole transporting layer 150 and the quantum dot light-emitting layer 130.

A highest occupied molecular orbital (HOMO) energy level of the second hole transporting layer 150 is greater than a HOMO energy level of the first hole transporting layer 140, and the HOMO energy level of the first hole transporting layer 140 is greater than an energy level of the quantum dot light-emitting layer 130.

The greater a difference between energy levels of two film layers, the higher a barrier between the two; the higher the barrier, the more difficult it is for a hole to transfer from a film layer of which a HOMO energy level is relatively high to a film layer of which a HOMO energy level is relatively low (that is, the smaller the number of holes transferring from the film layer of which the HOMO energy level is relatively high to the film layer of which the HOMO energy level is relatively low).

Thus, a barrier between the second hole transporting layer 150 and the quantum dot light-emitting layer 130 is relatively high, which makes it difficult for a hole to transfer from the second hole transporting layer 150 to the quantum dot light-emitting layer 130.

In the above implementation, the first hole transporting layer 140 is provided between the second hole transporting layer 150 and the quantum dot light-emitting layer 130, which may enable holes to firstly transfer from the second hole transporting layer 150 to the first hole transporting layer 140, and then transfer from the first hole transporting layer 140 to the quantum dot light-emitting layer 130. A barrier between the second hole transporting layer 150 and the first hole transporting layer 140 is relatively low, which makes it relatively easy for a hole to transfer from the second hole transporting layer 150 to the first hole transporting layer 140, so that the number of holes transferring to the first hole transporting layer 140 is relatively large. In addition, a barrier between the first hole transporting layer 140 and the quantum dot light-emitting layer 130 is relatively low, which makes it relatively easy for a hole to transfer from the first hole transporting layer 140 to the quantum dot light-emitting layer 130, so that the number of holes transferring to the quantum dot light-emitting layer 130 is relatively large. In this way, an efficiency of injecting the holes into the quantum dot light-emitting layer 130 is improved, which may make rates of respectively injecting the holes and the electrons balanced, so that a luminous efficiency of the light-emitting device 100 is improved.

Figure 5:
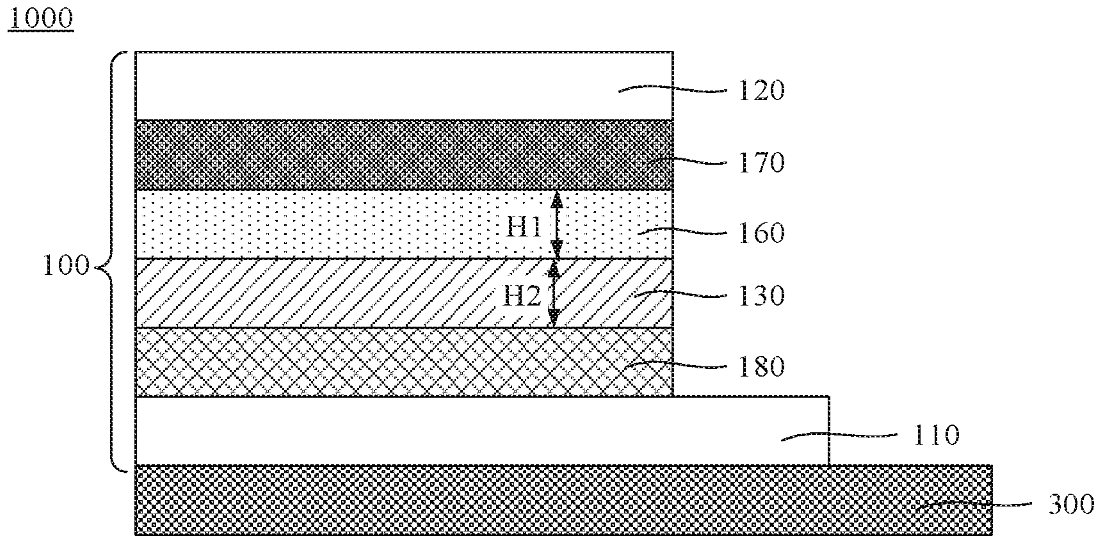
FIG. 5 is a structural diagram of another display panel, in accordance with some embodiments.

FIG. 5 is a structural diagram of the display panel 1000, in accordance with some embodiments.

Referring to FIG. 5, in some embodiments of the present disclosure, the light-emitting device 100 further includes a hole transporting doped layer 160. The hole transporting doped layer 160 is located between the quantum dot light-emitting layer 130 and the second electrode 120. The hole transporting doped layer 160 includes a mixture of at least two hole transporting materials, and HOMO energy levels of the at least two hole transporting materials are different.

The greater a difference between HOMO energy levels of two film layers (or materials), the higher a barrier between the two, and the more difficult it is for a hole to transfer from a structure of which a HOMO energy level is relatively high to a structure of which a HOMO energy level is relatively low (that is, the smaller the number of holes transferring from the structure of which the HOMO energy level is relatively high to the structure of which the HOMO energy level is relatively low). On the contrary, the less the difference between the HOMO energy levels of the two film layers (or materials), the lower the barrier between the two, and the larger the number of holes transferring from the structure of which the HOMO energy level is relatively high to the structure of which the HOMO energy level is relatively low.

In some embodiments of the present disclosure, the hole transporting doped layer 160 includes the mixture of the at least two hole transporting materials. In this case, the holes in the second electrode 120 may transfer to the quantum dot light-emitting layer 130 through the at least two hole transporting materials in sequence. In the hole transporting doped layer 160, the holes firstly pass through a hole transporting material of which a HOMO energy level is relatively high, and then pass through a hole transporting material of which a HOMO energy level is relatively low.

In the hole transporting doped layer 160, the at least two hole transporting materials are mixed, so that a contact area between any two hole transporting materials of which HOMO energy levels are close is relatively large. In a case where the holes transfer from the hole transporting material of which the HOMO energy level is relatively high to the hole transporting material of which the HOMO energy level is relatively low, a rate of transporting the holes is relatively high. In this way, a rate of injecting the holes into the quantum dot light-emitting layer 130 may be improved, which makes rates of respectively injecting the electrons and the holes into the quantum dot light-emitting layer 130 balanced, so that a luminous efficiency of the light-emitting device 100 is improved.

In some examples, the hole transporting doped layer 160 includes two, three, four or more hole transporting materials.

In some embodiments, mobilities of the at least two hole transporting materials are different; of any two hole transporting materials, a mobility of a hole transporting material of which a HOMO energy level is relatively low is less than a mobility of a hole transporting material of which a HOMO energy level is relatively high.

A mobility is an average drift velocity of carriers generated under unit electric field intensity, i.e., a measure of a speed at which the carriers move due to an action of an electric field. In a case where the mobility is large, the carriers move fast. In a case where the mobility is small, the carriers move slowly.

The more matched mobilities of two materials (or film layers), the closer the mobilities of the two materials (or film layers). In a case where carriers transfer from a material (or film layer) to the other material (or film layer), the more matched the mobilities of the two materials (or film layers), the larger the number of carriers transferring to the other material (or film layer) (that is, the higher a rate of transporting the carriers).

For example, the hole transporting doped layer 160 includes two hole transporting materials.

A mobility of the second electrode 120 is relatively high. During a process of transporting the holes, the holes generated by the second electrode 120 firstly pass through a hole transporting material of which a HOMO energy level is relatively high, and the hole transporting material of which the HOMO energy level is relatively high has a relatively high mobility. Thus, the mobility of the hole transporting material of which the HOMO energy level is relatively high may match the mobility of the second electrode 120, so that it is possible to improve an efficiency of transporting the holes between the second electrode 120 and the hole transporting material of which the HOMO energy level is relatively high.

A mobility of the quantum dot light-emitting layer 130 is relatively low. In the hole transporting doped layer 160, after the holes transfer from the hole transporting material of which the HOMO energy level is relatively high to a hole transporting material of which a HOMO energy level is relatively low, the holes transfer from the hole transporting material of which the HOMO energy level is relatively low to the quantum dot light-emitting layer 130. The mobility of the quantum dot light-emitting layer 130 is relatively low, and a mobility of the hole transporting material of which the HOMO energy level is relatively low is less than the mobility of the hole transporting material of which the HOMO energy level is relatively high. Thus, the mobility of the hole transporting material of which the HOMO energy level is relatively low better matches the mobility of the quantum dot light-emitting layer 130, so that it is possible to improve an efficiency of transporting the holes between the hole transporting material of which the HOMO energy level is relatively low and the quantum dot light-emitting layer 130.

In summary, the efficiency of transporting the holes between the second electrode 120 and the hole transporting material of which the HOMO energy level is relatively high and the efficiency of transporting the holes between the hole transporting material of which the HOMO energy level is relatively low and the quantum dot light-emitting layer 130 are both improved, so that it is possible to improve the efficiency of transporting the holes.

In some embodiments, the at least two hole transporting materials include at least two of following materials: 4,4'-bis(carbazole-9-yl)biphenyl (CBP), 1,3-bis(carbazol-9-yl) benzene (mCP), 2,6-bis(3-(9H-carbazol-9-yl)phenyl)pyridine (26DCzPPy), 4,4',4"-tris(carbazol-9-yl)triphenylamine (TCTA), 1,1-bis[4-[N,N'-di(p-tolyl)amino]phenyl]cyclohexane (TAPC) or N,N'-bis(naphthalen-1-yl)-N,N'-bis(phenyl)benzidine (NPB).

For example, a first hole transporting material may be TCTA, and a second hole transporting material may be NPB.

In some embodiments, the at least two hole transporting materials include the first hole transporting material and the second hole transporting material, and a HOMO energy level of the first hole transporting material is less than a HOMO energy level of the second hole transporting material. In the hole transporting doped layer 160, a mass ratio of the first hole transporting material to the second hole transporting material is in a range from 1:5 to 5:1. That is, in the hole transporting doped layer 160, a mass of the first hole transporting material is 0.2 to 5 times a mass of the second hole transporting material. A mobility of the first hole transporting material is less than a mobility of the second hole transporting material.

The mass ratio of the first hole transporting material to the second hole transporting material is greater than or equal to 1:5. That is, the mass of the first hole transporting material is greater than or equal to 0.2 times the mass of the second hole transporting material. Thus, it is possible to prevent the number of holes transferring from the first hole transporting material to the quantum dot light-emitting layer 130 from being too small due to a too small contact area, caused by a fact that a content of the first hole transporting material in the hole transporting doped layer 160 is too small (e.g., less than 0.2 times the mass of the second hole transporting material), between the first hole transporting material and the quantum dot light-emitting layer 130.

In addition, the mass ratio of the first hole transporting material to the second hole transporting material is less than or equal to 5:1. That is, the mass of the first hole transporting material is less than or equal to 5 times the mass of the second hole transporting material. Thus, it is possible to prevent the number of holes transferring from the second electrode 120 to the second hole transporting material from being too small due to a too small contact area, caused by a fact that a content of the second hole transporting material in the hole transporting doped layer 160 is too small, between the second hole transporting material and the second electrode 120.

The light-emitting device 100 includes a hole transporting portion. In some embodiments, the hole transporting portion is of a single-layer structure. In this case, the hole transporting portion includes only the hole transporting doped layer 160, based on which the hole transporting doped layer 160 will be described.

In some embodiments, the HOMO energy level of the first hole transporting material is less than the HOMO energy level of the second hole transporting material; in the hole transporting doped layer 160, the mass ratio of the first hole transporting material to the second hole transporting material is 2:1. In this case, the contact area between the second hole transporting material and the second electrode 120 is large enough, so that an efficiency of transporting the holes between the second hole transporting material and the second electrode 120 may be relatively large. In addition, the contact area between the first hole transporting material and the quantum dot light-emitting layer 130 is large enough, so that an efficiency of transporting the holes between the first hole transporting material and the quantum dot light-emitting layer may be relatively large.

In summary, the efficiency of transporting the holes between the second hole transporting material and the second electrode 120 is relatively large, and the efficiency of transporting the holes between the first hole transporting material and the quantum dot light-emitting layer 130 is also ensured to be relatively large, which may ensure the number of holes entering the quantum dot light-emitting layer 130, so that the efficiency of transporting the holes is ensured. As a result, the rates of respectively injecting the electrons and the holes into the quantum dot light-emitting layer 130 are balanced, so that the luminous efficiency of the light-emitting device 100 is improved.

Referring to FIG. 5, in some embodiments, a thickness H1 of the hole transporting doped layer 160 is 0.66 to 5 times a thickness H2 of the quantum dot light-emitting layer 130. That is, 0.66H2≤H1≤5H2.

The thickness H1 of the hole transporting doped layer 160 is greater than or equal to 0.66H2, which may prevent the first hole transporting material and the second hole transporting material in the hole transporting doped layer 160 from being too few due to a fact that the thickness H1 of the hole transporting doped layer 160 is too small (e.g., less than 0.66H2). Thus, it is possible to prevent the efficiency of transporting the holes from being relatively low due to a fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 5H2, which may prevent the first hole transporting material and the second hole transporting material in the hole transporting doped layer 160 from being too many due to a fact that the thickness H1 of the hole transporting doped layer 160 is too large (e.g., greater than 5H2). Thus, it is possible to not only avoid a waste of materials, but also avoid an excessive thickness of the light-emitting device 100 caused by an excessive thickness H1 of the hole transporting doped layer 160.

In some embodiments, the thickness H1 of the hole transporting doped layer 160 is 2.3 times the thickness H2 of the quantum dot light-emitting layer 130. That is, H1=2.3H2.

H1=2.3H2. That is, the hole transporting doped layer 160 may have a sufficient thickness, which ensures the contents of the first hole transporting material and the second hole transporting material in the hole transporting doped layer 160, thereby ensuring the efficiency of transporting the holes in the hole transporting doped layer 160. Furthermore, it is possible to avoid the waste of materials and the excessive thickness of the light-emitting device 100 that are both caused by the excessive thickness H1 of the hole transporting doped layer 160.

Referring to FIG. 5, in some embodiments, the thickness H1 of the hole transporting doped layer 160 is in a range from 20 nm to 50 nm. That is, 20 nm≤H1≤50 nm.

The thickness H1 of the hole transporting doped layer 160 is greater than or equal to 20 nm, which may prevent the first hole transporting material and the second hole transporting material in the hole transporting doped layer 160 from being too few due to the fact that the thickness H1 of the hole transporting doped layer 160 is too small (e.g., less than 20 nm). Thus, it is possible to prevent the efficiency of transporting the holes from being relatively low due to the fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 50 nm, which may prevent the first hole transporting material and the second hole transporting material in the hole transporting doped layer 160 from being too many due to the fact that the thickness H1 of the hole transporting doped layer 160 is too large (e.g., greater than 50 nm). Thus, it is possible to not only avoid the waste of materials, but also avoid the excessive thickness of the light-emitting device 100 caused by the excessive thickness H1 of the hole transporting doped layer 160.

For example, the thickness H1 of the hole transporting doped layer 160 is 35 nm.

In some examples, the thickness H2 of the quantum dot light-emitting layer 130 is in a range from 10 nm to 30 nm. That is, 10 nm≤H2≤30 nm.

For example, the thickness H2 of the quantum dot light-emitting layer 130 is 20 nm. Of course, the thickness of the quantum dot light-emitting layer may be 15 nm, 17 nm, 23 nm, 25 nm or the like, which will not be listed one by one here.

Referring to FIG. 5, in some embodiments, the light-emitting device 100 further includes a hole injection layer (HIL) 170 and an electron transporting layer (ETL) 180. The hole injection layer 170 is located between the second electrode 120 and the hole transporting doped layer 160. The electron transporting layer 180 is located between the first electrode 110 and the quantum dot light-emitting layer 130.

The provision of the hole injection layer 170 may improve the efficiency of transporting hole, so as to improve the luminous efficiency of the light-emitting device 100.

A material of the hole injection layer 170 includes poly (3,4-ethylenedioxythiophene)-polystyrene sulfonate (PEDOT: PSS 4083). In addition, the material of the hole injection layer 170 may further include molybdenum oxide.

In some examples, a thickness of the hole injection layer 170 is in a range from 5 nm to 20 nm, inclusive. For example, the thickness of the hole injection layer 170 is 7 nm.

The provision of the electron transporting layer 180 may improve the efficiency of transporting electron, so as to improve the luminous efficiency of the light-emitting device 100.

The electron transporting layer 180 may be a zinc oxide based nanoparticle film or a zinc oxide film. In addition, in a case where the electron transporting layer 180 is the zinc oxide based nanoparticle film, a material of the electron transporting layer 180 may adopt ion-doped zinc oxide nanoparticles such as zinc oxide nanoparticles doped with magnesium (Mg), indium (In), Al or gallium (Ga).

In some examples, a thickness of the electron transporting layer 180 is in a range from 25 nm to 55 nm, inclusive. For example, the thickness of the electron transporting layer 180 is 40 nm In the embodiments of the present disclosure, a reference light-emitting device and a test light-emitting device 1 will be tested. The reference light-emitting device includes a first electrode 110, an electron transporting layer 180, a quantum dot light-emitting layer 130, a first hole transporting layer 140, a second hole transporting layer 150, a hole injection layer 170 and a second electrode 120 that are sequentially arranged in a stack. Of the first hole transporting layer 140, a thickness is 10 nm, and a material is TCTA. Of the second hole transporting layer 150, a thickness is 30 nm, and a material is NPB.

The test light-emitting device 1 includes a first electrode 110, an electron transporting layer 180, a quantum dot light-emitting layer 130, a hole transporting doped layer 160, a hole injection layer 170 and a second electrode 120 that are sequentially arranged in a stack. A thickness of the hole transporting doped layer 160 is 35 nm. In the hole transporting doped layer 160, a first hole transporting material is TCTA, a second hole transporting material is NPB, and a doping ratio of TCTA to NPB is 2:1.

It will be noted that, as for each of the reference light-emitting device and the test light-emitting device 1, of the first electrode 110, a material is ITO, and a thickness is 120 nm; of the electron transporting layer 180, a material is zinc oxide, and a thickness is 40 nm; a material of the quantum dot light-emitting layer 130 includes CdS and CdSe, and CdS is surrounded by CdSe; a thickness of the quantum dot light-emitting layer 130 is 20 nm, and the quantum dot light-emitting layer 130 is a red quantum dot light-emitting layer; of the hole injection layer 170, a material is molybdenum oxide ($MoO_3$), and a thickness is 7 nm; of the second electrode 120, a material is Ag, and a thickness is 120 nm.

Figure 6:
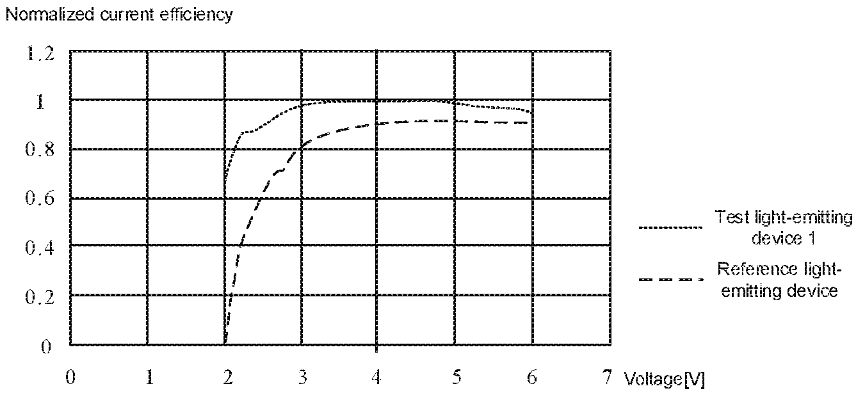
FIG. 6 is a schematic diagram showing variations in current efficiencies with voltages, in accordance with some embodiments.

A schematic diagram of current efficiencies as shown in FIG. 6 may be obtained after the test.

It can be seen from FIG. 6 that the current efficiency of the test light-emitting device 1 is significantly higher than the current efficiency of the reference light-emitting device. The higher a current efficiency, the higher a luminous efficiency of a respective device. Therefore, a luminous efficiency of the test light-emitting device 1 is significantly higher than a luminous efficiency of the reference light-emitting device. It can be seen therefrom that it is possible to effectively improve the luminous efficiency of the light-emitting device 100 by providing the hole transporting doped layer 160 in the light-emitting device 100.

In the above embodiments, an embodiment in which the hole transporting portion includes only the hole transporting doped layer 160 is described.

Figure 7:
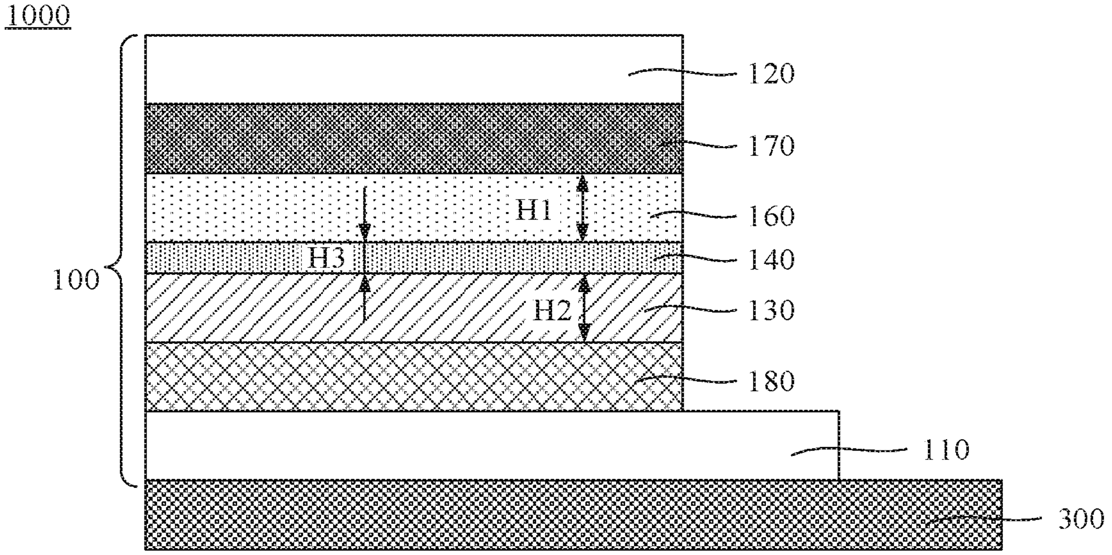
FIG. 7 is a structural diagram of a display panel, in accordance with some other embodiments.

FIG. 7 is a structural diagram of the display panel 1000, in accordance with some other embodiments.

Referring to FIG. 7, in some other embodiments, the light-emitting device 100 further includes a first hole transporting layer 140. The first hole transporting layer 140 is located between the quantum dot light-emitting layer 130 and the hole transporting doped layer 160. A HOMO energy level of the first hole transporting layer 140 is less than or equal to the HOMO energy level of the first hole transporting material, and is greater than a HOMO energy level of the quantum dot light-emitting layer 130.

The first hole transporting layer 140 is provided between the quantum dot light-emitting layer 130 and the hole transporting doped layer 160. Thus, the holes transfer from the first hole transporting material in the hole transporting doped layer 160 to the first hole transporting layer 140, and then transfer from the first hole transporting layer 140 to the quantum dot light-emitting layer 130.

In a case where the HOMO energy level of the first hole transporting layer 140 is less than the HOMO energy level of the first hole transporting material, a difference between the HOMO energy level of the first hole transporting layer 140 and the HOMO energy level of the first hole transporting material is less than a difference between the HOMO energy level of the quantum dot light-emitting layer 130 and the HOMO energy level of the first hole transporting material. Thus, a barrier between the first hole transporting layer 140 and the first hole transporting material is less than a barrier between the quantum dot light-emitting layer 130 and the first hole transporting material. Therefore, for the holes, transferring from the first hole transporting material to the first hole transporting layer 140 is easier than transferring from the first hole transporting material to the quantum dot light-emitting layer 130. Similarly, a difference between the HOMO energy level of the quantum dot light-emitting layer 130 and the HOMO energy level of the first hole transporting layer 140 is less than the difference between the HOMO energy level of the quantum dot light-emitting layer 130 and the HOMO energy level of the first hole transporting material. Thus, a barrier between the quantum dot light-emitting layer 130 and the first hole transporting layer 140 is less than the barrier between the quantum dot light-emitting layer 130 and the first hole transporting material. Therefore, for the holes, transferring from the first hole transporting layer 140 to the quantum dot light-emitting layer 130 is easier than transferring from the first hole transporting material to the quantum dot light-emitting layer 130.

Thus, the first hole transporting layer 140 is disposed between the quantum dot light-emitting layer 130 and the hole transporting doped layer 160, which may improve the efficiency of transporting the holes, so that the rates of respectively injecting the electrons and the holes into the quantum dot light-emitting layer 130 are more balanced. As a result, the luminous efficiency of the light-emitting device 100 is improved.

In a case where the HOMO energy level of the first hole transporting layer 140 is equal to the HOMO energy level of the first hole transporting material, the first hole transporting layer 140 may include the first hole transporting material.

In some embodiments, a mobility of the first hole transporting layer 140 is less than or equal to the mobility of the first hole transporting material, and is greater than the mobility of the quantum dot light-emitting layer 130.

In a case where the mobility of the first hole transporting layer 140 is less than the mobility of the first hole transporting material, a difference between the mobility of the first hole transporting layer 140 and the mobility of the first hole transporting material is less than a difference between the mobility of the quantum dot light-emitting layer 130 and the mobility of the first hole transporting material. Therefore, the mobility of the first hole transporting layer 140 better matches the mobility of the first hole transporting material. Thus, for the holes, transferring from the first hole transporting material to the first hole transporting layer 140 is easier than transferring from the first hole transporting material to the quantum dot light-emitting layer 130.

Similarly, a difference between the mobility of the quantum dot light-emitting layer 130 and the mobility of the first hole transporting layer 140 is less than the difference between the mobility of the quantum dot light-emitting layer 130 and the mobility of the first hole transporting material. Therefore, the mobility of the first hole transporting layer 140 better matches the mobility of the quantum dot light-emitting layer 130. Thus, for the holes, transferring from the first hole transporting layer 140 to the quantum dot light-emitting layer 130 is easier than transferring from the first hole transporting material to the quantum dot light-emitting layer 130.

Thus, the first hole transporting layer 140 is disposed between the quantum dot light-emitting layer 130 and the hole transporting doped layer 160, which may improve the efficiency of transporting the holes, so that the rates of respectively injecting the electrons and the holes into the quantum dot light-emitting layer 130 are more balanced. As a result, the luminous efficiency of the light-emitting device 100 is improved.

In a case where the mobility of the first hole transporting layer 140 is equal to the mobility of the first hole transporting material, the first hole transporting layer 140 includes the first hole transporting material.

In some embodiments, the first hole transporting layer 140 includes the first hole transporting material. Therefore, a difference between an energy level of the first hole transporting material in the first hole transporting layer 140 and an energy level of the first hole transporting material in the hole transporting doped layer 160 is equal to zero.

The first hole transporting layer 140 includes the another first hole transporting material, which may improve a contact area between the first hole transporting material and the quantum dot light-emitting layer 130, so that it is possible to improve the efficiency of transporting the holes. As a result, the rates of respectively injecting the electrons and the holes into the quantum dot light-emitting layer 130 are more balanced, so that the luminous efficiency of the light-emitting device 100 is improved.

In some embodiments, in a case where the light-emitting device 100 includes the first hole transporting layer 140 and the hole transporting doped layer 160, in the hole transporting doped layer 160, the mass ratio of the first hole transporting material to the second hole transporting material is 2:1. In this case, the contact area between the second hole transporting material in the hole transporting doped layer 160 and the second electrode 120 is large enough, so that the efficiency of transporting the holes between the second hole transporting material and the second electrode 120 may be relatively large. In addition, the contact area between the first hole transporting material in the hole transporting doped layer 160 and the first hole transporting layer 140 is large enough. In this way, a relatively large number of holes may transfer from the first hole transporting material in the hole transporting doped layer 160 to the first hole transporting layer 140, and then there are enough holes transferring from the first hole transporting layer 140 to the quantum dot light-emitting layer 130, so that a relatively large efficiency of transporting the holes between the first hole transporting material and the quantum dot light-emitting layer 130 is ensured.

In summary, the efficiency of transporting the holes between the second hole transporting material and the second electrode 120 is relatively large, and the efficiency of transporting the holes between the first hole transporting material and the quantum dot light-emitting layer 130 is also ensured to be relatively large, which may ensure the number of holes entering the quantum dot light-emitting layer 130, so that the efficiency of transporting the holes is ensured. As a result, the rates of respectively injecting the electrons and the holes into the quantum dot light-emitting layer 130 are more balanced, so that the luminous efficiency of the light-emitting device 100 is improved.

Referring to FIG. 7, in some embodiments, in the case where the light-emitting device 100 includes the hole transporting doped layer 160 and the first hole transporting layer 140, the thickness H1 of the hole transporting doped layer 160 is 0.33 to 5 times the thickness H2 of the quantum dot light-emitting layer 130. That is, $0.33H2 \leq H1 \leq 5H2$. The thickness H1 of the hole transporting doped layer 160 is greater than or equal to 0.33H2, which may prevent the first hole transporting material and the second hole transporting material in the hole transporting doped layer 160 from being too few due to the fact that the thickness H1 of the hole transporting doped layer 160 is too small (e.g., less than 0.33H2). Thus, it is possible to prevent the efficiency of transporting the holes from being relatively low due to the fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 5H2), which may prevent the first hole transporting material and the second hole transporting material in the hole transporting doped layer 160 from being too many due to the fact that the thickness H1 of the hole transporting doped layer 160 is too large (e.g., greater than 5H2). Thus, it is possible to not only avoid the waste of materials, but also avoid the excessive thickness of the light-emitting device 100 caused by the excessive thickness H1 of the hole transporting doped layer 160.

Referring to FIG. 7, in some embodiments, in the case where the light-emitting device 100 includes the hole transporting doped layer 160 and the first hole transporting layer 140, a thickness H3 of the first hole transporting layer 140 is 0.06 to 2 times the thickness H1 of the hole transporting doped layer 160. That is, $0.06H1 \leq H3 \leq 2H1$. The thickness H3 of the first hole transporting layer 140 is greater than or equal to 0.06H1, which may avoid a problem that nanobumps are formed during the quantum dot light-emitting layer 130 is formed due to a fact that the thickness H3 of the first hole transporting layer 140 is too small (e.g., less than 0.06H1). If the thickness of the first hole transporting layer 140 is too small, a surface of the first hole transporting layer 140 will be uneven, which is not conducive to a yield of the light-emitting device 100. Therefore, $H3 \geq 0.06H1$, which may make the first hole transporting layer 140 have a sufficient thickness, so that the first hole transporting layer 140 is ensured to have an even surface. As a result, the yield of the light-emitting device 100 is ensured.

In addition, the thickness H3 of the first hole transporting layer 140 is less than or equal to 2H1, which may prevent the thickness H3 of the first hole transporting layer 140 from being too large (e.g., greater than 2H1), so that it is possible to avoid a relatively large thickness of the entire light-emitting device 100 caused by an excessive thickness H3 of the first hole transporting layer 140.

Referring to FIG. 7, in some embodiments, in the case where the light-emitting device 100 includes the hole transporting doped layer 160 and the first hole transporting layer 140, the thickness H3 of the first hole transporting layer 140 is one third of the thickness H1 of the hole transporting doped layer 160. In this case, it is possible to make the first hole transporting layer 140 have the sufficient thickness, so that the first hole transporting layer 140 is ensured to have the even surface. As a result, the yield of the light-emitting device 100 is ensured. Furthermore, it is possible to avoid the waste of materials and the excessive thickness of the light-emitting device 100 that are both caused by the excessive thickness H3 of the first hole transporting layer 140.

Referring to FIG. 7, in some embodiments, in the case where the light-emitting device 100 includes the hole transporting doped layer 160 and the first hole transporting layer 140, the thickness H1 of the hole transporting doped layer 160 is in a range from 10 nm to 50 nm.

The thickness H1 of the hole transporting doped layer 160 is greater than or equal to 10 nm, which may prevent the first hole transporting material and the second hole transporting material in the hole transporting doped layer 160 from being too few due to the fact that the thickness H1 of the hole transporting doped layer 160 is too small (e.g., less than 10 nm). Thus, it is possible to prevent the efficiency of transporting the holes from being relatively low due to the fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 50 nm, which may prevent the first hole transporting material and the second hole transporting material in the hole transporting doped layer 160 from being too many due to the fact that the thickness H1 of the hole transporting doped layer 160 is too large (e.g., greater than 50 nm). Thus, it is possible to not only avoid the waste of materials, but also avoid the excessive size of the light-emitting device 100 caused by the excessive thickness H1 of the hole transporting doped layer 160.

For example, the thickness H1 of the hole transporting doped layer 160 is 30 nm.

Referring to FIG. 7, in some embodiments, in the case where the light-emitting device 100 includes the hole transporting doped layer 160 and the first hole transporting layer 140, the thickness H3 of the first hole transporting layer 140 is in a range from 3 nm to 20 nm. That is, 3 nm≤H3≤20 nm.

The thickness H3 of the first hole transporting layer 140 is greater than or equal to 3 nm, which may avoid the problem that the nanobumps are formed during the quantum dot light-emitting layer 130 is formed due to the fact that the thickness H3 of the first hole transporting layer 140 is too small (e.g., less than 3 nm). If the thickness of the first hole transporting layer 140 is too small, the surface of the first hole transporting layer 140 will be uneven, which is not conducive to the yield of the light-emitting device 100. Therefore, H3≥3 nm, which may make the first hole transporting layer 140 have the sufficient thickness, so that the first hole transporting layer 140 is ensured to have the even surface. As a result, the yield of the light-emitting device 100 is ensured.

In addition, the thickness H3 of the first hole transporting layer 140 is less than or equal to 20 nm, which may prevent the thickness H3 of the first hole transporting layer 140 from being too large (e.g., greater than 20 nm), so that it is possible to avoid the relatively large thickness of the entire light-emitting device 100 caused by the excessive thickness H3 of the first hole transporting layer 140.

For example, the thickness H3 of the first hole transporting layer 140 is 10 nm.

In some embodiments of the present disclosure, a reference light-emitting device and a test light-emitting device 2 will be tested. The reference light-emitting device includes a first electrode 110, an electron transporting layer 180, a quantum dot light-emitting layer 130, a first hole transporting layer 140, a second hole transporting layer 150, a hole injection layer 170 and a second electrode 120 that are sequentially arranged in a stack. Of the first hole transporting layer 140, a thickness is 10 nm, and a material is TCTA. Of the second hole transporting layer 150, a thickness is 30 nm, and a material is NPB.

The test light-emitting device 2 includes a first electrode 110, an electron transporting layer 180, a quantum dot light-emitting layer 130, a first hole transporting layer 140, a hole transporting doped layer 160, a hole injection layer 170 and a second electrode 120 that are sequentially arranged in a stack. Of the first hole transporting layer 140, a thickness is 10 nm, and a material is TCTA. A thickness of the hole transporting doped layer 160 is 30 nm. In the hole transporting doped layer 160, a first hole transporting material is TCTA, a second hole transporting material is NPB, and a doping ratio of TCTA to NPB is 2:1.

It will be noted that, as for each of the reference light-emitting device and the test light-emitting device 2, of the first electrode 110, a material is ITO, and a thickness is 120 nm; of the electron transporting layer 180, a material is zinc oxide, and a thickness is 40 nm; a material of the quantum dot light-emitting layer 130 includes CdS and CdSe, and CdS is surrounded by CdSe; a thickness of the quantum dot light-emitting layer 130 is 20 nm, and the quantum dot light-emitting layer 130 is a red quantum dot light-emitting layer; of the hole injection layer 170, a material is MoOs, and a thickness is 7 nm; of the second electrode 120, a material is Ag, and a thickness is 120 nm.

Figure 8:
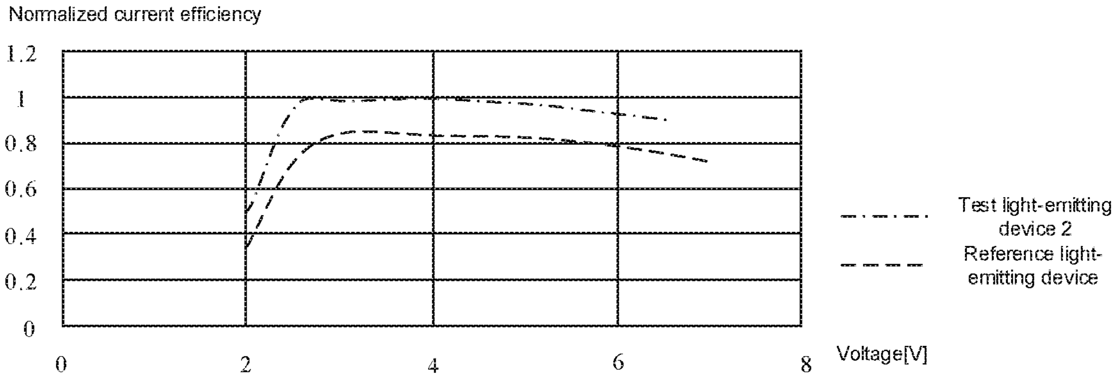
FIG. 8 is a schematic diagram showing variations in current efficiencies with voltages, in accordance with some other embodiments.

A schematic diagram of current efficiencies as shown in FIG. 8 may be obtained after the test.

It can be seen from FIG. 8 that the current efficiency of the test light-emitting device 2 is significantly higher than the current efficiency of the reference light-emitting device. The higher a current efficiency, the higher a luminous efficiency of a respective device. Therefore, a luminous efficiency of the test light-emitting device 2 is significantly higher than a luminous efficiency of the reference light-emitting device. It can be seen therefrom that it is possible to effectively improve the luminous efficiency of the light-emitting device 100 by providing the first hole transporting layer 140 and the hole transporting doped layer 160 in the light-emitting device 100.

In the above embodiments, an embodiment in which the hole transporting portion includes the first hole transporting layer 140 and the hole transporting doped layer 160 is described.

Figure 9:
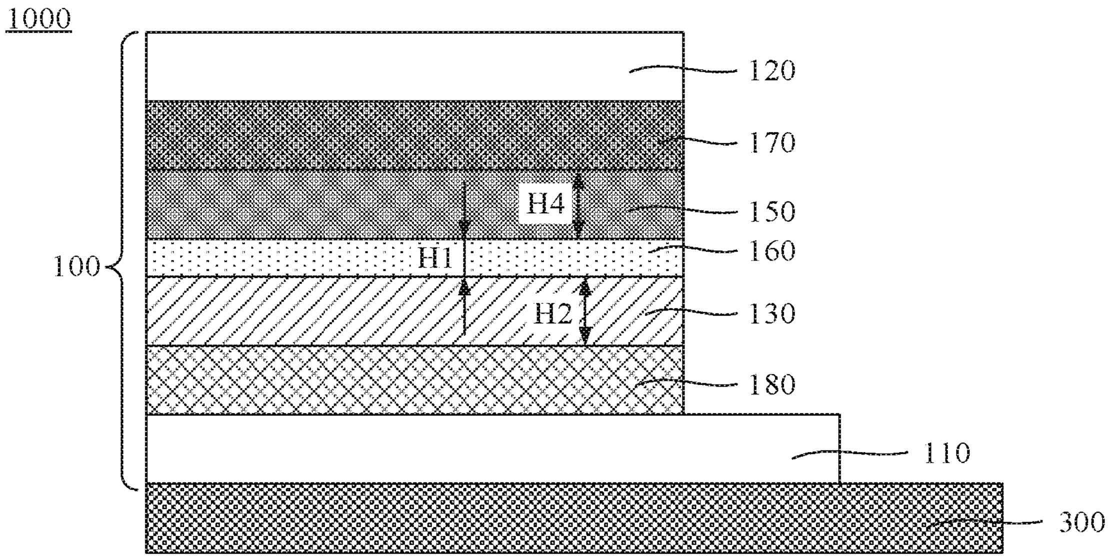
FIG. 9 is a structural diagram of a display panel, in accordance with yet other embodiments.

FIG. 9 is a structural diagram of the display panel 1000, in accordance with yet other embodiments.

Referring to FIG. 9, in yet other embodiments, the light-emitting device 100 further includes a second hole transporting layer 150. The second hole transporting layer 150 is located between the hole transporting doped layer 160 and the second electrode 120. A HOMO energy level of the second hole transporting layer 150 is less than a HOMO energy level of the second electrode 120, and is greater than or equal to the HOMO energy level of the second hole transporting material.

In a case where the light-emitting device 100 further includes the hole injection layer 170, the second hole transporting layer 150 is located between the hole transporting doped layer 160 and the hole injection layer 170.

The second hole transporting layer 150 is provided between the second electrode 120 and the hole transporting doped layer 160. Thus, the holes transfer from the second electrode 120 to the second hole transporting layer 150, and then transfer from the second hole transporting layer 150 to the second hole transporting material in the hole transporting doped layer 160.

In a case where the HOMO energy level of the second hole transporting layer 150 is greater than the HOMO energy level of the second hole transporting material, a difference between the HOMO energy level of the second hole transporting layer 150 and the HOMO energy level of the second electrode 120 is less than a difference between the HOMO energy level of the second hole transporting material and the HOMO energy level of the second electrode 120. Thus, a barrier between the second hole transporting layer 150 and the second electrode 120 is less than a barrier between the second hole transporting material and the second electrode 120. Therefore, for the holes, transferring from the second electrode 120 to the second hole transporting layer 150 is easier than transferring from the second electrode 120 to the second hole transporting material. Similarly, a difference between the HOMO energy level of the second hole transporting material and the HOMO energy level of the second hole transporting layer 150 is less than the difference between the HOMO energy level of the second hole transporting material and the HOMO energy level of the second electrode 120. Thus, a barrier between the second hole transporting material and the second hole transporting layer 150 is less than the barrier between the second hole transporting material and the second electrode 120. Therefore, for the holes, transferring from the second hole transporting layer 150 to the second hole transporting material is easier than transferring from the second electrode 120 to the second hole transporting material. Thus, the second hole transporting layer 150 is disposed between the second electrode 120 and the hole transporting doped layer 160, which may improve the efficiency of transporting the holes, so that the rates of respectively injecting the electrons and the holes into the second electrode 120 are balanced. As a result, the luminous efficiency of the light-emitting device 100 is improved.

In a case where the HOMO energy level of the second hole transporting layer 150 is equal to the HOMO energy level of the second hole transporting material, the second hole transporting layer 150 may include the second hole transporting material.

In some embodiments, a mobility of the second hole transporting layer 150 is less than the mobility of the second electrode 120, and is greater than or equal to the mobility of the second hole transporting material.

In a case where the mobility of the second hole transporting layer 150 is greater than the mobility of the second hole transporting material, a difference between the mobility of the second hole transporting layer 150 and the mobility of the second hole transporting material is less than a difference between the mobility of the second electrode 120 and the mobility of the second hole transporting material. Therefore, the mobility of the second hole transporting layer 150 better matches the mobility of the second electrode 120. Thus, for the holes, transferring from the second hole transporting layer 150 to the second hole transporting material is easier than transferring from the second electrode 120 to the second hole transporting material. Similarly, a difference between the mobility of the second electrode 120 and the mobility of the second hole transporting layer 150 is less than the difference between the mobility of the second electrode 120 and the mobility of the second hole transporting material. Therefore, the mobility of the second hole transporting layer 150 better matches the mobility of the second electrode 120. Thus, for the holes, transferring from the second electrode 120 to the second hole transporting layer 150 is easier than transferring from the second electrode 120 to the second hole transporting material.

Thus, the second hole transporting layer 150 is disposed between the second electrode 120 and the hole transporting doped layer 160, which may improve the efficiency of transporting the holes, so that the rates of respectively injecting the electrons and the holes into the second electrode 120 are balanced. As a result, the luminous efficiency of the light-emitting device 100 is improved.

In a case where the mobility of the second hole transporting layer 150 is equal to the mobility of the second hole transporting material, the second hole transporting layer 150 includes the second hole transporting material.

In some embodiments, the second hole transporting layer 150 includes the second hole transporting material. Therefore, a difference between an energy level of the second hole transporting material in the second hole transporting layer 150 and an energy level of the second hole transporting material in the hole transporting doped layer 160 is equal to zero.

The second hole transporting layer 150 includes the second hole transporting material, which may improve a contact area between the second hole transporting materials and the second electrode 120, so that it is possible to improve the efficiency of transporting the holes. As a result, the rates of respectively injecting the electrons and the holes into the quantum dot light-emitting layer 130 are more balanced, so that the luminous efficiency of the light-emitting device 100 is improved.

In some embodiments, in a case where the light-emitting device 100 includes the second hole transporting layer 150 and the hole transporting doped layer 160, in the hole transporting doped layer 160, the mass ratio of the first hole transporting material to the second hole transporting material is 1:1.

In this case, the contact area between the second hole transporting material in the hole transporting doped layer 160 and the second electrode 120 is large enough. Thus, a relatively large number of holes may transfer from the second electrode 120 to the second hole transporting layer 150 and the second hole transporting material, and then there are enough holes transferring from the second hole transporting material to the first hole transporting material, so that the efficiency of transporting the holes between the second electrode 120 and the second hole transporting material may be ensured to be relatively large. In addition, the contact area between the first hole transporting material in the hole transporting doped layer 160 and the quantum dot light-emitting layer 130 is large enough, so that the efficiency of transporting the holes between the first hole transporting material and the quantum dot light-emitting layer 130 may be ensured to be relatively large.

In summary, the efficiency of transporting the holes between the second hole transporting material and the second electrode 120 is relatively large, and the efficiency of transporting the holes between the first hole transporting material and the quantum dot light-emitting layer 130 is also ensured to be relatively large, which may ensure the number of holes entering the quantum dot light-emitting layer 130, so that the efficiency of transporting the holes is ensured. As a result, the rates of respectively injecting the electrons and the holes into the quantum dot light-emitting layer 130 are more balanced, so that the luminous efficiency of the light-emitting device 100 is improved.

Referring to FIG. 9, in some embodiments, in the case where the light-emitting device 100 includes the second hole transporting layer 150 and the hole transporting doped layer 160, the thickness H1 of the hole transporting doped layer 160 is 0.1 to 2 times the thickness H2 of the quantum dot light-emitting layer 130. That is, $0.1H2 \le H1 \le 2H2$.

The thickness H1 of the hole transporting doped layer 160 is greater than or equal to 0.1H2, which may prevent the first hole transporting material and the second hole transporting material in the hole transporting doped layer 160 from being too few due to the fact that the thickness H1 of the hole transporting doped layer 160 is too small (e.g., less than 0.1H2). Thus, it is possible to prevent the efficiency of transporting the holes from being relatively low due to the fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 2H2, which may prevent the first hole transporting material and the second hole transporting material in the hole transporting doped layer 160 from being too many due to the fact that the thickness H1 of the hole transporting doped layer 160 is too large (e.g., greater than 2H2). Thus, it is possible to not only avoid the waste of materials, but also avoid the excessive thickness of the light-emitting device 100 caused by the excessive thickness H1 of the hole transporting doped layer 160.

Referring to FIG. 9, in some embodiments, in the case where the light-emitting device 100 includes the second hole transporting layer 150 and the hole transporting doped layer 160, a thickness H4 of the second hole transporting layer 150 is 0.5 to 16.66 times the thickness H1 of the hole transporting doped layer 160. That is, 0.5H1≤H4≤16.66H1.

The thickness H4 of the second hole transporting layer 150 is greater than or equal to 0.5H1, which may avoid a too low efficiency, caused by a fact that the second hole transporting material is too few due to a fact that the thickness H4 of the second hole transporting layer 150 is too small (e.g., less than 0.5H1), of transporting the holes between the second hole transporting material and the second electrode 120.

In addition, the thickness H4 of the second hole transporting layer 150 is less than or equal to 16.66H1, which may prevent the thickness H4 of the second hole transporting layer 150 from being too large (e.g., greater than 16.66H1), so that it is possible to avoid the relatively large thickness of the entire light-emitting device 100 caused by an excessive thickness H4 of the second hole transporting layer 150.

Referring to FIG. 9, in some embodiments, in the case where the light-emitting device 100 includes the second hole transporting layer 150 and the hole transporting doped layer 160, the thickness H4 of the second hole transporting layer 150 is 3 times the thickness H1 of the hole transporting doped layer 160. That is, H4=3H1.

Referring to FIG. 9, in some embodiments, in the case where the light-emitting device 100 includes the second hole transporting layer 150 and the hole transporting doped layer 160, the thickness H1 of the hole transporting doped layer 160 is in a range from 3 nm to 20 nm. That is, 3 nm≤H1≤20 nm.

The thickness H1 of the hole transporting doped layer 160 is greater than or equal to 3 nm, which may prevent the first hole transporting material and the second hole transporting material in the hole transporting doped layer 160 from being too few due to the fact that the thickness H1 of the hole transporting doped layer 160 is too small (e.g., less than 3 nm). Thus, it is possible to prevent the efficiency of transporting the holes from being relatively low due to the fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 20 nm, which may prevent the first hole transporting material and the second hole transporting material in the hole transporting doped layer 160 from being too many due to the fact that the thickness H1 of the hole transporting doped layer 160 is too large (e.g., greater than 20 nm). Thus, it is possible to not only avoid the waste of materials, but also avoid the excessive thickness of the light-emitting device 100 caused by the excessive thickness H1 of the hole transporting doped layer 160.

For example, the thickness H1 of the hole transporting doped layer 160 is 10 nm.

Referring to FIG. 9, in some embodiments, in the case where the light-emitting device 100 includes the second hole transporting layer 150 and the hole transporting doped layer 160, the thickness H4 of the second hole transporting layer 150 is in a range from 10 nm to 50 nm. That is, 10 nm≤H4≤50 nm.

The thickness H4 of the second hole transporting layer 150 is greater than or equal to 10 nm, which may avoid the too low efficiency, caused by the fact that the second hole transporting material is too few due to the fact that the thickness H4 of the second hole transporting layer 150 is too small (e.g., less than 10 nm), of transporting the holes between the second hole transporting material and the second electrode 120.

In addition, the thickness H4 of the second hole transporting layer 150 is less than or equal to 50 nm, which may prevent the thickness H4 of the second hole transporting layer 150 from being too large (e.g., greater than 50 nm), so that it is possible to avoid the relatively large thickness of the entire light-emitting device 100 caused by the excessive thickness H4 of the second hole transporting layer 150.

For example, in the case where the light-emitting device 100 includes the second hole transporting layer 150 and the hole transporting doped layer 160, the thickness H4 of the second hole transporting layer 150 is 30 nm.

In the embodiments of the present disclosure, a reference light-emitting device and a test light-emitting device 3 will be tested. The reference light-emitting device includes a first electrode 110, an electron transporting layer 180, a quantum dot light-emitting layer 130, a first hole transporting layer 140, a second hole transporting layer 150, a hole injection layer 170 and a second electrode 120 that are sequentially arranged in a stack. Of the first hole transporting layer 140, a thickness is 10 nm, and a material is TCTA. Of the second hole transporting layer 150, a thickness is 30 nm, and a material is NPB.

The test light-emitting device 3 includes a first electrode 110, an electron transporting layer 180, a quantum dot light-emitting layer 130, a hole transporting doped layer 160, a second hole transporting layer 150, a hole injection layer 170 and a second electrode 120 that are sequentially arranged in a stack. A thickness of the hole transporting doped layer 160 is 10 nm. In the hole transporting doped layer 160, a first hole transporting material is TCTA, a second hole transporting material is NPB, and a doping ratio of TCTA to NPB is 1:1. Of the second hole transporting layer 150, a thickness is 30 nm, and a material is NPB.

It will be noted that, as for each of the reference light-emitting device and the test light-emitting device 3, of the first electrode 110, a material is ITO, and a thickness is 120 nm; of the electron transporting layer 180, a material is zinc oxide, and a thickness is 40 nm; a material of the quantum dot light-emitting layer 130 includes CdS and CdSe, and CdS is surrounded by CdSe; a thickness of the quantum dot light-emitting layer 130 is 20 nm, and the quantum dot light-emitting layer 130 is a red quantum dot light-emitting layer; of the hole injection layer 170, a material is $MoO_3$, and a thickness is 7 nm; of the second electrode 120, a material is Ag, and a thickness is 120 nm.

Figure 10:
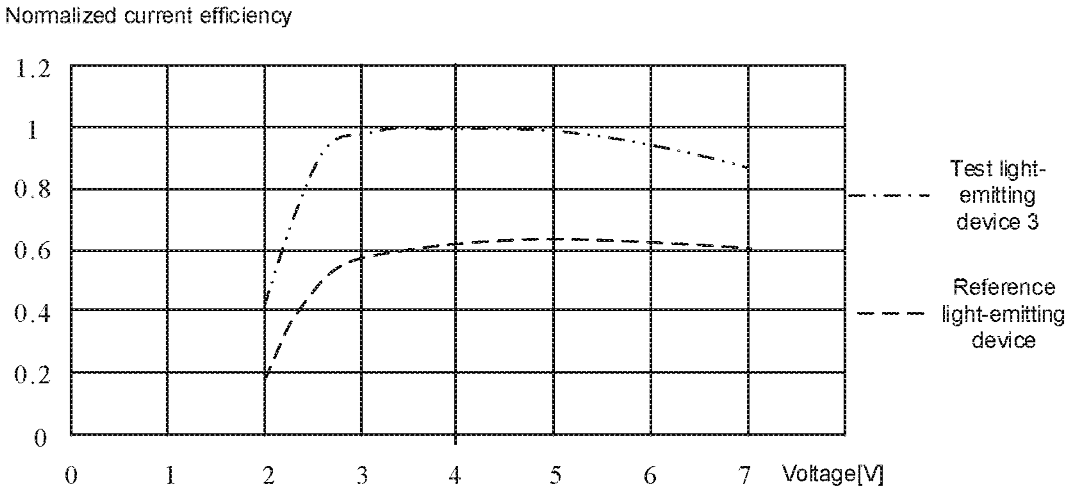
FIG. 10 is a schematic diagram showing variations in current efficiencies with voltages, in accordance with yet other embodiments.

A schematic diagram of current efficiencies as shown in FIG. 10 may be obtained after the test.

It can be seen from FIG. 10 that a current efficiency of the test light-emitting device 3 is significantly higher than a current efficiency of the reference light-emitting device. The higher a current efficiency, the higher a luminous efficiency of a respective device. Therefore, a luminous efficiency of the test light-emitting device 3 is significantly higher than a luminous efficiency of the reference light-emitting device. It can be seen therefrom that it is possible to effectively improve the luminous efficiency of the light-emitting device 100 by providing the second hole transporting layer 150 and the hole transporting doped layer 160 in the light-emitting device 100.

In the above embodiments, an embodiment in which the hole transporting portion includes the second hole transporting layer 150 and the hole transporting doped layer 160 is described.

Figure 11:
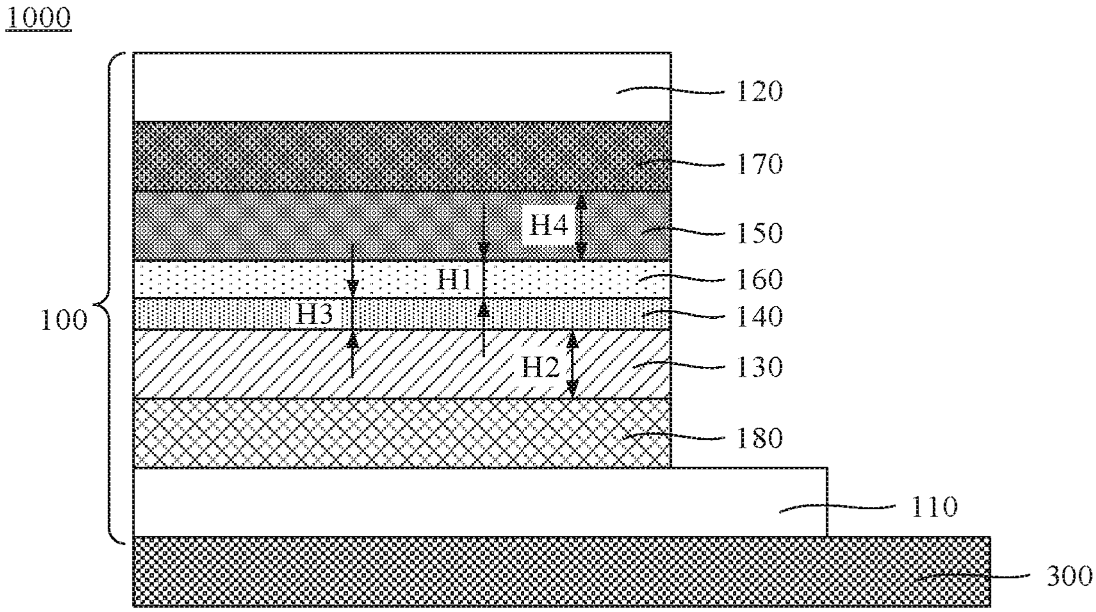
FIG. 11 is a structural diagram of a display panel, in accordance with yet other embodiments.

FIG. 11 is a structural diagram of the display panel 1000, in accordance with yet other embodiments.

Referring to FIG. 11, in yet other embodiments, the light-emitting device 100 further includes a first hole transporting layer 140 and a second hole transporting layer 150. The first hole transporting layer 140 is located between the quantum dot light-emitting layer 130 and the hole transporting doped layer 160. A HOMO energy level of the first hole transporting layer 140 is less than or equal to the HOMO energy level of the first hole transporting material, and is greater than the HOMO energy level of the quantum dot light-emitting layer 130. The second hole transporting layer 150 is located between the hole transporting doped layer 160 and the second electrode 120. A HOMO energy level of the second hole transporting layer 150 is less than the HOMO energy level of the second electrode 120, and is greater than or equal to the HOMO energy level of the second hole transporting material.

It can be seen from the above that the first hole transporting layer 140 is provided between the quantum dot light-emitting layer 130 and the hole transporting doped layer 160, and the second hole transporting layer 150 is provided between the second electrode 120 and the hole transporting doped layer 160, which may both improve the efficiency of transporting the holes, so that the rates of respectively injecting the electrons and the holes into the quantum dot light-emitting layer 130 are more balanced. As a result, the luminous efficiency of the light-emitting device 100 is improved.

In some embodiments, in a case where the light-emitting device 100 includes the first hole transporting layer 140, the second hole transporting layer 150 and the hole transporting doped layer 160, a mobility of the first hole transporting layer 140 is less than or equal to the mobility of the first hole transporting material, and is greater than the mobility of the quantum dot light-emitting layer 130; a mobility of the second hole transporting layer 150 is less than the mobility of the second electrode 120, and is greater than or equal to the mobility of the second hole transporting material. It can be seen from the above that, with this arrangement, the efficiency of transporting the holes may be improved, which makes the rates of respectively injecting the electrons and the holes into the quantum dot light-emitting layer 130 more balanced, so that the luminous efficiency of the light-emitting device 100 is improved.

In some embodiments, the first hole transporting layer 140 includes the first hole transporting material; the second hole transporting layer 150 includes the second hole transporting material.

The first hole transporting layer 140 includes the first hole transporting material, which may improve a contact area between the first hole transporting materials and the quantum dot light-emitting layer 130, so that it is possible to improve the efficiency of transporting the holes. As a result, the rates of respectively injecting the electrons and the holes into the quantum dot light-emitting layer 130 are more balanced, so that the luminous efficiency of the light-emitting device 100 is improved.

The second hole transporting layer 150 includes the second hole transporting material, which may improve a contact area between the second hole transporting materials and the second electrode 120, so that it is possible to improve the efficiency of transporting the holes. As a result, the rates of respectively injecting the electrons and the holes into the quantum dot light-emitting layer 130 are more balanced, so that the luminous efficiency of the light-emitting device 100 is improved.

In some embodiments, in the case where the light-emitting device 100 includes the first hole transporting layer 140, the second hole transporting layer 150 and the hole transporting doped layer 160, in the hole transporting doped layer 160, the mass ratio of the first hole transporting material to the second hole transporting material is 1:1.

In this case, the contact area between the second hole transporting material in the hole transporting doped layer 160 and the second electrode 120 is large enough. In this way, a relatively large number of holes may transfer from the second electrode 120 to the second hole transporting layer 150 and the second hole transporting material, and then there are enough holes transferring from the second hole transporting material to the first hole transporting material, so that the efficiency of transporting the holes between the second electrode 120 and the second hole transporting material may be ensured to be relatively large.

In addition, the contact area between the first hole transporting material in the hole transporting doped layer 160 and the first hole transporting layer 140 is large enough. In this way, a relatively large number of holes may transfer from the first hole transporting material in the hole transporting doped layer 160 to the first hole transporting layer 140, and then there are enough holes transferring from the first hole transporting layer 140 to the quantum dot light-emitting layer 130, so that the relatively large efficiency of transporting the holes between the first hole transporting material and the quantum dot light-emitting layer 130 is ensured.

In some embodiments, in the case where the light-emitting device 100 includes the first hole transporting layer 140, the second hole transporting layer 150 and the hole transporting doped layer 160, the thickness H1 of the hole transporting doped layer 160 is 0.1 to 2 times the thickness H2 of the quantum dot light-emitting layer 130. That is, $0.1H2 \le H1 \le 2H2$.

The thickness H1 of the hole transporting doped layer 160 is greater than or equal to 0.1H2, which may prevent the first hole transporting material and the second hole transporting material in the hole transporting doped layer 160 from being too few due to the fact that the thickness H1 of the hole transporting doped layer 160 is too small (e.g., less than 0.1H2). Thus, it is possible to prevent the efficiency of transporting the holes from being relatively low due to the fact that the first hole transporting material and the second hole transporting material are too few, so that the efficiency of transporting the holes in the hole transporting doped layer 160 may be ensured.

In addition, the thickness H1 of the hole transporting doped layer 160 is less than or equal to 2H2, which may prevent the first hole transporting material and the second hole transporting material in the hole transporting doped layer 160 from being too many due to the fact that the thickness H1 of the hole transporting doped layer 160 is too large (e.g., greater than 2H2). Thus, it is possible to not only avoid the waste of materials, but also avoid the excessive thickness of the light-emitting device 100 caused by the excessive thickness H1 of the hole transporting doped layer 160.

In the case where the light-emitting device 100 includes the first hole transporting layer 140, the second hole transporting layer 150 and the hole transporting doped layer 160, a thickness H3 of the first hole transporting layer 140 is 0.15 to 6.67 times the thickness H1 of the hole transporting doped layer 160. That is, $0.15H1 \le H3 \le 6.67H1$.

The thickness H3 of the first hole transporting layer 140 is greater than or equal to 0.15H1, which may avoid a problem that nanobumps are formed during the quantum dot light-emitting layer 130 is formed due to a fact that the thickness H3 of the first hole transporting layer 140 is too small (e.g., less than 0.15H1). If the thickness of the first hole transporting layer 140 is too small, a surface of the first hole transporting layer 140 will be uneven, which is not conducive to the yield of the light-emitting device 100. Therefore, H3≥0.15H1, which may make the first hole transporting layer 140 have a sufficient thickness, so that the first hole transporting layer 140 is ensured to have an even surface. As a result, the yield of the light-emitting device 100 is ensured.

In addition, the thickness H3 of the first hole transporting layer 140 is less than or equal to 6.67H1, which may prevent the thickness H3 of the first hole transporting layer 140 from being too large (e.g., greater than 6.67H1), so that it is possible to avoid the relatively large thickness of the entire light-emitting device 100 caused by an excessive thickness H3 of the first hole transporting layer 140.

In the case where the light-emitting device 100 includes the first hole transporting layer 140, the second hole transporting layer 150 and the hole transporting doped layer 160, a thickness H4 of the second hole transporting layer 150 is 0.5 to 16.67 times the thickness H1 of the hole transporting doped layer 160. That is, 0.15H1≤H4≤16.67H1.

The thickness H4 of the second hole transporting layer 150 is greater than or equal to 0.5H1, which may avoid a too low efficiency, caused by a fact that the second hole transporting material is too few due to a fact that the thickness H4 of the second hole transporting layer 150 is too small (e.g., less than 0.5H1), of transporting the holes between the second hole transporting material and the second electrode 120.

In addition, the thickness H4 of the second hole transporting layer 150 is less than or equal to 16.67H1, which may prevent the thickness H4 of the second hole transporting layer 150 from being too large (e.g., greater than 16.67H1), so that it is possible to avoid the relatively large thickness of the entire light-emitting device 100 caused by an excessive thickness H4 of the second hole transporting layer 150.

In some embodiments, in the case where the light-emitting device 100 includes the first hole transporting layer 140, the second hole transporting layer 150 and the hole transporting doped layer 160, the thickness H3 of the first hole transporting layer 140 is 1 time the thickness H1 of the hole transporting doped layer 160. That is, H3=H1. In this case, it is possible to make the first hole transporting layer 140 have the sufficient thickness, so that the first hole transporting layer 140 is ensured to have the even surface. As a result, the yield of the light-emitting device 100 is ensured. Furthermore, it is possible to avoid the waste of materials and the excessive thickness of the light-emitting device 100 that are both caused by the excessive thickness H3 of the first hole transporting layer 140.

In some embodiments, in the case where the light-emitting device 100 includes the first hole transporting layer 140, the second hole transporting layer 150 and the hole transporting doped layer 160, the thickness H4 of the second hole transporting layer 150 is 6 times the thickness H1 of the hole transporting doped layer 160. That is, H4=6H1.

In some embodiments, in the case where the light-emitting device 100 includes the first hole transporting layer 140, the second hole transporting layer 150 and the hole transporting doped layer 160, the thickness H1 of the hole transporting doped layer 160 is in a range from 3 nm to 20 nm.

The thickness H1 of the hole transporting doped layer 160 is greater than or equal to 3 nm, which may prevent the first hole transporting material and the second hole transporting material in the hole transporting doped layer 160 from being too few due to the fact that the thickness H1 of the hole transporting doped layer 160 is too small (e.g., less than 3 nm). Thus, it is possible to prevent the efficiency of transporting the holes from being relatively low, so that the efficiency of transporting the holes in the hole transporting doped layer 160 may be ensured.

In addition, the thickness H1 of the hole transporting doped layer 160 is less than or equal to 20 nm, which may prevent the first hole transporting material and the second hole transporting material in the hole transporting doped layer 160 from being too many due to the fact that the thickness H1 of the hole transporting doped layer 160 is too large (e.g., greater than 20 nm). Thus, it is possible to not only avoid the waste of materials, but also avoid the excessive size of the light-emitting device 100 caused by the excessive thickness H1 of the hole transporting doped layer 160.

For example, in the case where the light-emitting device 100 includes the first hole transporting layer 140, the second hole transporting layer 150 and the hole transporting doped layer 160, the thickness H1 of the hole transporting doped layer 160 is 5 nm.

In some embodiments, in the case where the light-emitting device 100 includes the first hole transporting layer 140, the second hole transporting layer 150 and the hole transporting doped layer 160, the thickness H3 of the first hole transporting layer 140 is in a range from 3 nm to 20 nm.

The thickness H3 of the first hole transporting layer 140 is greater than or equal to 3 nm, which may avoid the problem that the nanobumps are formed during the quantum dot light-emitting layer 130 is formed due to the fact that the thickness H3 of the first hole transporting layer 140 is too small (e.g., less than 3 nm). If the thickness of the first hole transporting layer 140 is too small, the surface of the first hole transporting layer 140 will be uneven, which is not conducive to the yield of the light-emitting device 100. Therefore, H3≥3 nm, which may make the first hole transporting layer 140 have the sufficient thickness, so that the first hole transporting layer 140 is ensured to have the even surface. As a result, the yield of the light-emitting device 100 is ensured.

In addition, the thickness H3 of the first hole transporting layer 140 is less than or equal to 20 nm, which may prevent the thickness H3 of the first hole transporting layer 140 from being too large (e.g., greater than 20 nm), so that it is possible to avoid the relatively large thickness of the entire light-emitting device 100 caused by the excessive thickness H3 of the first hole transporting layer 140.

For example, in the case where the light-emitting device 100 includes the first hole transporting layer 140, the second hole transporting layer 150 and the hole transporting doped layer 160, the thickness H3 of the first hole transporting layer 140 is 5 nm.

In some embodiments, in the case where the light-emitting device 100 includes the first hole transporting layer 140, the second hole transporting layer 150 and the hole transporting doped layer 160, the thickness H4 of the second hole transporting layer 150 is in a range from 10 nm to 50 nm.

The thickness H4 of the second hole transporting layer 150 is greater than or equal to 10 nm, which may avoid the too low efficiency, caused by the fact that the second hole transporting material is too few due to the fact that the thickness H4 of the second hole transporting layer 150 is too small (e.g., less than 10 nm), of transporting the holes between the second hole transporting material and the second electrode 120.

In addition, the thickness H4 of the second hole transporting layer 150 is less than or equal to 50 nm, which may prevent the thickness H4 of the second hole transporting layer 150 from being too large (e.g., greater than 50 nm), so that it is possible to avoid the relatively large thickness of the entire light-emitting device 100 caused by the excessive thickness H4 of the second hole transporting layer 150.

For example, in the case where the light-emitting device 100 includes the first hole transporting layer 140, the second hole transporting layer 150 and the hole transporting doped layer 160, the thickness H4 of the second hole transporting layer 150 is 30 nm.

In the embodiments of the present disclosure, a reference light-emitting device and a test light-emitting device 4 will be tested. The reference light-emitting device includes a first electrode 110, an electron transporting layer 180, a quantum dot light-emitting layer 130, a first hole transporting layer 140, a second hole transporting layer 150, a hole injection layer 170 and a second electrode 120 that are sequentially arranged in a stack. Of the first hole transporting layer 140, a thickness is 10 nm, and a material is TCTA. Of the second hole transporting layer 150, a thickness is 30 nm, and a material is NPB.

The test light-emitting device 4 includes a first electrode 110, an electron transporting layer 180, a quantum dot light-emitting layer 130, a first hole transporting layer 140, a hole transporting doped layer 160, a second hole transporting layer 150, a hole injection layer 170 and a second electrode 120 that are sequentially arranged in a stack. Of the first hole transporting layer 140, a thickness is 5 nm, and a material is TCTA. A thickness of the hole transporting doped layer 160 is 5 nm. In the hole transporting doped layer 160, a first hole transporting material is TCTA, a second hole transporting material is NPB, and a doping ratio of TCTA to NPB is 1:1. Of the second hole transporting layer 150, a thickness is 40 nm, and a material is NPB.

It will be noted that, as for each of the reference light-emitting device and the test light-emitting device 4, of the first electrode 110, a material is ITO, and a thickness is 120 nm; of the electron transporting layer 180, a material is zinc oxide, and a thickness is 40 nm; a material of the quantum dot light-emitting layer 130 includes CdS and CdSe, and CdS is surrounded by CdSe; a thickness of the quantum dot light-emitting layer 130 is 20 nm, and the quantum dot light-emitting layer 130 is a red quantum dot light-emitting layer; of the hole injection layer 170, a material is $MoO_3$, and a thickness is 7 nm; of the second electrode 120, a material is Ag, and a thickness is 120 nm.

Figure 12:
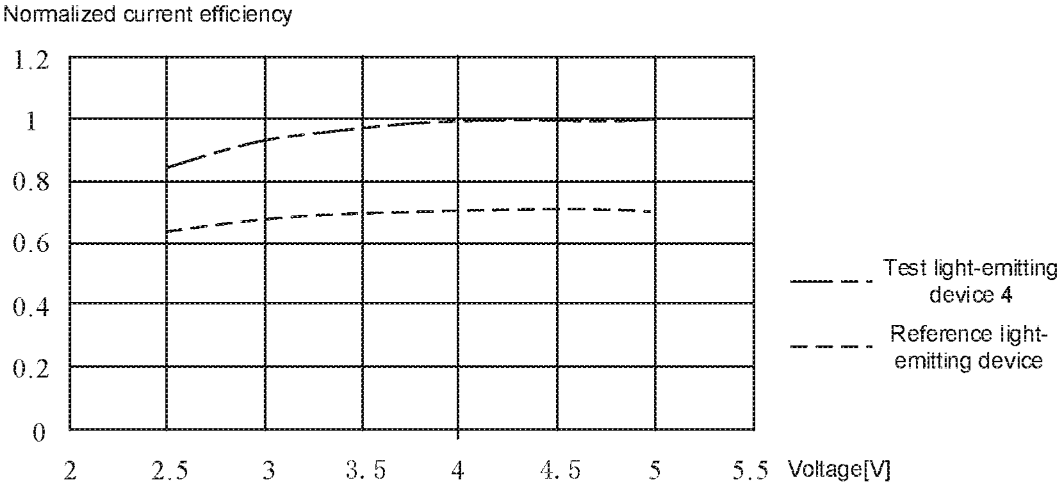
FIG. 12 is a schematic diagram showing variations in current efficiencies with voltages, in accordance with yet other embodiments.

A schematic diagram of current efficiencies as shown in FIG. 12 may be obtained after the test.

It can be seen from FIG. 12 that a current efficiency of the test light-emitting device 4 is significantly higher than a current efficiency of the reference light-emitting device. The higher a current efficiency, the higher a luminous efficiency of a respective device. Therefore, a luminous efficiency of the test light-emitting device 4 is significantly higher than a luminous efficiency of the reference light-emitting device. It can be seen therefrom that it is possible to effectively improve the luminous efficiency of the light-emitting device 100 by providing the first hole transporting layer 140, the second hole transporting layer 150 and the hole transporting doped layer 160 in the light-emitting device 100.

In some embodiments, the hole transporting doped layer 160 includes a plurality of doped sub-layers that are arranged in a stack. Of any two adjacent doped sub-layers, a mass ratio of a first hole transporting material to a second hole transporting material in a doped sub-layer proximate to the quantum dot light-emitting layer 130 is greater than a mass ratio of a first hole transporting material to a second hole transporting material in a doped sub-layer away from the quantum dot light-emitting layer 130.

Therefore, in the hole transporting doped layer 160, the closer to the quantum dot light-emitting layer 130, the greater a proportion of the first hole transporting material. Thus, the contact area between the first hole transporting material in the hole transporting doped layer 160 and the quantum dot light-emitting layer 130 may be improved, which improves the efficiency of transporting the holes between the first hole transporting material in the hole transporting doped layer 160 and the quantum dot light-emitting layer 130, so that the number of holes injected into the quantum dot light-emitting layer 130 may be improved. As a result, the balance between injecting the holes and injecting the electrons is improved, so that the luminous efficiency of the light-emitting device 100 is improved.

The closer to the second electrode 120, the greater a proportion of the second hole transporting material. Therefore, the contact area between the second hole transporting material in the hole transporting doped layer 160 and the second electrode 120 may be improved, which may improve the efficiency of transporting the holes between the second hole transporting material and the second electrode 120, so that the number of holes injected into the quantum dot light-emitting layer 130 may be improved. As a result, the balance between injecting the holes and injecting the electrons is improved, so that the luminous efficiency of the light-emitting device 100 is improved.

In the above embodiments, the film layer structure of the light-emitting device 100 is described, and the first hole transporting material and the second hole transporting material will be described below.

In some embodiments, the HOMO energy level of the first hole transporting material is 0.88 to 1.02 times the HOMO energy level of the quantum dot light-emitting layer 130.

Values of the HOMO energy level of the first hole transporting material and the HOMO energy level of the quantum dot light-emitting layer 130 are both negative. Therefore, the HOMO energy level of the first hole transporting material is greater than or equal to 0.88 times the HOMO energy level of the quantum dot light-emitting layer 130, which may avoid a too large difference between the HOMO energy level of the first hole transporting material and the HOMO energy level of the quantum dot light-emitting layer 130 (i.e., a too high barrier between the first hole transporting material and the quantum dot light-emitting layer 130) caused by a fact that the HOMO energy level of the first hole transporting material is too high. In this way, it is possible to prevent the efficiency of transporting the holes between the first hole transporting material and the quantum dot light-emitting layer 130 from being too low.

In addition, the values of the HOMO energy level of the first hole transporting material and the HOMO energy level of the quantum dot light-emitting layer 130 are both negative. Therefore, the HOMO energy level of the first hole transporting material is less than or equal to 1.02 times the HOMO energy level of the quantum dot light-emitting layer 130, which may prevent a barrier between the first hole transporting material and the second hole transporting material from being too high due to a too large difference, caused by a fact that the HOMO energy level of the first hole transporting material is too low, between the HOMO energy level of the first hole transporting material and the HOMO energy level of the second hole transporting material. In this way, it is possible to prevent the efficiency of transporting the holes between the first hole transporting material and the second hole transporting material from being too low.

In some embodiments, the HOMO energy level of the second hole transporting material is 0.82 to 0.97 times the HOMO energy level of the quantum dot light-emitting layer 130.

Values of the HOMO energy level of the second hole transporting material and the HOMO energy level of the quantum dot light-emitting layer 130 are both negative. Therefore, the HOMO energy level of the second hole transporting material is greater than or equal to 0.82 times the HOMO energy level of the quantum dot light-emitting layer 130, which may prevent the barrier between the first hole transporting material and the second hole transporting material from being too high due to the too large difference, caused by a fact that the HOMO energy level of the second hole transporting material is too high, between the HOMO energy level of the first hole transporting material and the HOMO energy level of the second hole transporting material. In this way, it is possible to prevent the efficiency of transporting the holes between the first hole transporting material and the second hole transporting material from being too low.

In addition, the values of the HOMO energy level of the second hole transporting material and the HOMO energy level of the quantum dot light-emitting layer 130 are both negative. Therefore, the HOMO energy level of the second hole transporting material is made less than or equal to 0.97 times the HOMO energy level of the quantum dot light-emitting layer 130, which may prevent a barrier between the second hole transporting material and the second electrode 120 from being too high due to a too large difference, caused by a fact that the HOMO energy level of the second hole transporting material is too low, between the HOMO energy level of the second hole transporting material and the HOMO energy level of the second electrode 120. In this way, it is possible to prevent the efficiency of transporting the holes between the second hole transporting material and the second electrode 120 from being too low.

In some embodiments, the HOMO energy level of the first hole transporting material is in a range from −6.3 eV to −5.9 eV.

The HOMO energy level of the first hole transporting material is less than or equal to −5.9 eV, which may prevent the barrier between the first hole transporting material and the quantum dot light-emitting layer 130 from being too high due to the too large difference, caused by a fact that the HOMO energy level of the first hole transporting material is too high (e.g., greater than −5.9 eV), between the HOMO energy level of the first hole transporting material and the HOMO energy level of the quantum dot light-emitting layer 130. In this way, it is possible to prevent the efficiency of transporting the holes between the first hole transporting material and the quantum dot light-emitting layer 130 from being too low.

In addition, the HOMO energy level of the first hole transporting material is made greater than or equal to −6.3 eV, which may prevent the barrier between the first hole transporting material and the second hole transporting material from being too high due to the too large difference, caused by a fact that the HOMO energy level of the first hole transporting material is too low (e.g., less than −6.3 eV), between the HOMO energy level of the first hole transporting material and the HOMO energy level of the second hole transporting material. In this way, it is possible to prevent the efficiency of transporting the holes between the first hole transporting material and the second hole transporting material from being too low.

In some embodiments, the HOMO energy level of the second hole transporting material is in a range from −6 eV to −5.5 eV.

The HOMO energy level of the second hole transporting material is less than or equal to −5.5 eV, which may avoid a too large difference between the HOMO energy level of the first hole transporting material and the HOMO energy level of the second hole transporting material (i.e., a too high barrier between the first hole transporting material and the second hole transporting material) caused by a fact that the HOMO energy level of the second hole transporting material is too high (e.g., greater than −5.5 eV). In this way, it is possible to prevent the efficiency of transporting the holes between the first hole transporting material and the second hole transporting material from being too low.

In addition, the HOMO energy level of the second hole transporting material is made greater than or equal to −6 eV, which may prevent the barrier between the second hole transporting material and the second electrode 120 from being too high due to the too large difference, caused by a fact that the HOMO energy level of the second hole transporting material is too low (e.g., less than −6 eV), between the HOMO energy level of the second hole transporting material and the HOMO energy level of the second electrode 120. In this way, it is possible to prevent the efficiency of transporting the holes between the second hole transporting material and the second electrode 120 from being too low.

In some embodiments, the mobility of the first hole transporting material is 1 to $10^3$ times the mobility of the quantum dot light-emitting layer 130.

The mobility of the first hole transporting material is less than or equal to $10^3$ times the mobility of the quantum dot light-emitting layer 130, which may avoid a too large difference between the mobility of the first hole transporting material and the mobility of the quantum dot light-emitting layer 130 (i.e., a mismatch between the first hole transporting material and the quantum dot light-emitting layer 130) caused by a fact that the mobility of the first hole transporting material is too high. In this way, it is possible to prevent the efficiency of transporting the holes between the first hole transporting material and the quantum dot light-emitting layer 130 from being too low.

In addition, the mobility of the first hole transporting material is greater than or equal to 1 time the mobility of the quantum dot light-emitting layer 130, which may avoid a mismatch between the first hole transporting material and the second hole transporting material due to a too large difference, caused by a fact that the mobility of the first hole transporting material is too low, between the mobility of the first hole transporting material and the mobility of the second hole transporting material. In this way, it is possible to prevent the efficiency of transporting the holes between the first hole transporting material and the second hole transporting material from being too low.

In some embodiments, the mobility of the second hole transporting material is $10^2$ to $10^4$ times the mobility of the quantum dot light-emitting layer 130.

The mobility of the second hole transporting material is less than or equal to $10^4$ times the mobility of the quantum dot light-emitting layer 130, which may avoid the mismatch between the first hole transporting material and the second hole transporting material due to the too large difference, caused by a fact that the mobility of the second hole transporting material is too high, between the mobility of the second hole transporting material and the mobility of the first hole transporting material. In this way, it is possible to prevent the efficiency of transporting the holes between the first hole transporting material and the second hole transporting material from being too low.

In addition, the mobility of the second hole transporting material is greater than or equal to $10^2$ times the mobility of the quantum dot light-emitting layer 130, which may avoid a mismatch between the second hole transporting material and the second electrode 120 due to a too large difference, caused by a fact that the mobility of the second hole transporting material is too low, between the mobility of the second hole transporting material and the mobility of the second electrode 120. In this way, it is possible to prevent the efficiency of transporting the holes between the second hole transporting material and the second electrode 120 from being too low.

In some embodiments, the mobility of the first hole transporting material is in a range from $10^{-5}$ $cm^2V^{-1}s^{-1}$ to $10^{-3}$ $cm^2V^{-1}s^{-1}$.

The mobility of the first hole transporting material is less than or equal to $10^{-3}$ $cm^2V^{-1}s^{-1}$, which may avoid the too large difference between the mobility of the first hole transporting material and the mobility of the quantum dot light-emitting layer 130 (i.e., the mismatch between the first hole transporting material and the quantum dot light-emitting layer 130) caused by a fact that the mobility of the first hole transporting material is too high (e.g., greater than $10^{-3}$ $cm^2V^{-1}s^{-1}$). In this way, it is possible to prevent the efficiency of transporting the holes between the first hole transporting material and the quantum dot light-emitting layer 130 from being too low.

In addition, the mobility of the first hole transporting material is greater than or equal to $10^{-5}$ $cm^2V^{-1}s^{-1}$, which may avoid the mismatch between the first hole transporting material and the second hole transporting material due to the too large difference, caused by a fact that the mobility of the first hole transporting material is too low (e.g., less than $10^{-5}$ $cm^2V^{-1}s^{-1}$), between the mobility of the first hole transporting material and the mobility of the second hole transporting material. In this way, it is possible to prevent the efficiency of transporting the holes between the first hole transporting material and the second hole transporting material from being too low.

In some embodiments, the mobility of the second hole transporting material is in a range from $10^{-3}$ $cm^2V^{-1}s^{-1}$ to $10^{-2}$ $cm^2V^{-1}s^{-1}$.

The mobility of the second hole transporting material is less than or equal to $10^{-2}$ $cm^2V^{-1}s^{-1}$, which may avoid the mismatch between the first hole transporting material and the second hole transporting material due to the too large difference, caused by a fact that the mobility of the second hole transporting material is too high (e.g., greater than $10^{-2}$ $cm^2V^{-1}s^{-1}$), between the mobility of the second hole transporting material and the mobility of the first hole transporting material. In this way, it is possible to prevent the efficiency of transporting the holes between the first hole transporting material and the second hole transporting material from being too low.

In addition, the mobility of the second hole transporting material is greater than or equal to $10^{-3}$ $cm^2V^{-1}s^{-1}$, which may avoid the mismatch between the second hole transporting material and the second electrode 120 due to the too large difference, caused by a fact that the mobility of the second hole transporting material is too low (e.g., less than $10^{-3}$ $cm^2V^{-1}s^{-1}$), between the mobility of the second hole transporting material and the mobility of the second electrode 120. In this way, it is possible to prevent the efficiency of transporting the holes between the second hole transporting material and the second electrode 120 from being too low.

In some embodiments, the hole transporting material may be a material such as carbazole, triphenylamine, a carbazole derivative or a triphenylamine derivative.

In summary, the light-emitting device 100 provided in some embodiments of the present disclosure may effectively improve the efficiency of injecting the holes into the quantum dot light-emitting layer 130 by providing the hole transporting doped layer 160 in the light-emitting device 100, which makes the rates of respectively injecting the holes and the electrons balanced, thereby improving the luminous efficiency of the light-emitting device 100.

The display panel 1000 provided in some embodiments of the present disclosure includes the light-emitting device 100 provided in the above embodiments. Therefore, the display panel 1000 provided in some embodiments of the present disclosure includes all beneficial effects of the light-emitting device 100 provided in the above embodiments, which will not be repeated here.

The display apparatus 2000 provided in some embodiments of the present disclosure includes the display panel 1000 provided in the above embodiments. Therefore, the display apparatus 2000 provided in some embodiments of the present disclosure includes all beneficial effects of the display panel 1000 provided in the above embodiments, which will not be repeated here.

Some embodiments of the present disclosure provide a method of manufacturing a light-emitting device, and the method is used for manufacturing the light-emitting device 100 provided in the above embodiments.

Figure 13:
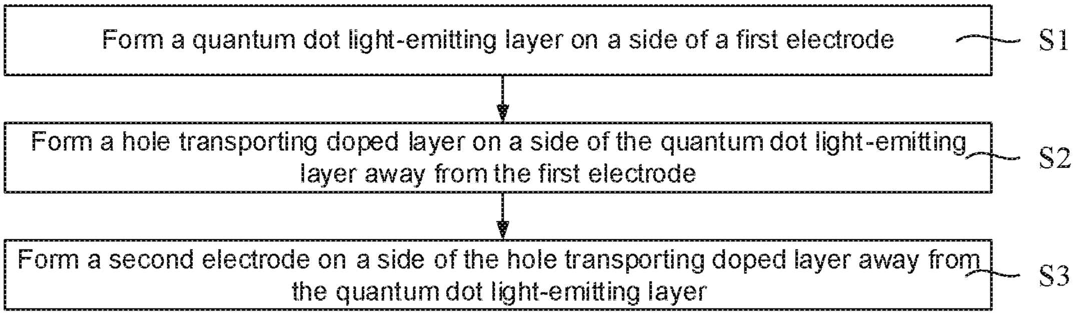
FIG. 13 is a flow diagram of a method of manufacturing a light-emitting device, in accordance with some embodiments.

FIG. 13 is a flow diagram of the method of manufacturing the light-emitting device, in accordance with some embodiments.

Referring to FIG. 13, the method of manufacturing the light-emitting device includes following steps S1 to S3.

With continued reference to FIG. 5, in the step S1, a quantum dot light-emitting layer 130 is formed on a side of a first electrode 110.

The first electrode 110 may be conductive glass.

Before the quantum dot light-emitting layer 130 is formed, it is possible to rinse the conductive glass with water and isopropanol and then perform an ultraviolet treatment thereon for 5 to 10 minutes.

The quantum dot light-emitting layer 130 may be formed by spin coating.

In the step S2, a hole transporting doped layer 160 is formed on a side of the quantum dot light-emitting layer 130 away from the first electrode 110; the hole transporting doped layer 160 includes a mixture of at least two hole transporting materials, and HOMO energy levels of the at least two hole transporting materials are different.

In the hole transporting doped layer 160, the at least two hole transporting materials are mixed, so that a contact area between any two hole transporting materials of which HOMO energy levels are close is relatively large. In a case where the holes transfer from a hole transporting material of which a HOMO energy level is relatively high to a hole transporting material of which a HOMO energy level is relatively low, a rate of transporting the holes is relatively high. In this way, a rate of injecting the holes into the quantum dot light-emitting layer 130 may be improved, which makes rates of respectively injecting the electrons and the holes into the quantum dot light-emitting layer 130 balanced, so that a luminous efficiency of the light-emitting device 100 is improved.

For example, the hole transporting doped layer 160 may be formed by evaporating.

In the step S3, a second electrode 120 is formed on a side of the hole transporting doped layer 160 away from the quantum dot light-emitting layer 130.

The second electrode 120 may be an Al film or an Ag film that may be formed by evaporating.

In addition, the second electrode 120 may be IZO. In this case, IZO may be formed by sputtering.

After the step S3, the light-emitting device 100 may be encapsulated. For example, the light-emitting device 100 may be encapsulated by using an ultraviolet curing adhesive.

In some embodiments, the at least two hole transporting materials include a first hole transporting material and a second hole transporting material, and a HOMO energy level of the first hole transporting material is less than a HOMO energy level of the second hole transporting material.

In the step S2 of forming the hole transporting doped layer 160 on the side of the quantum dot light-emitting layer 130 away from the first electrode 110, the first hole transporting material and the second hole transporting material are simultaneously deposited on the side of the first electrode 110 by a dual-source co-evaporation method, so as to form the hole transporting doped layer 160.

The dual-source co-evaporation method refers to that two evaporation sources, of which one is used for evaporating the first hole transporting material, and the other is used for evaporating the second hole transporting material, are both disposed in a film coating chamber, and evaporation temperatures of the first hole transporting material and the second hole transporting material may be changed for changing evaporation rates of the two.

For example, in the step S2, a ratio of the evaporation rate of the first hole transporting material to the evaporation rate of the second hole transporting material is in a range from 1:5 to 5:1, so that a mass ratio of the first hole transporting material to the second hole transporting material that are both in the hole transporting doped layer 160 may be in a range from 1:5 to 5:1.

In some examples, a hole transporting portion includes only the hole transporting doped layer 160. In the step S2, the ratio of the evaporation rate of the first hole transporting material to the evaporation rate of the second hole transporting material is 2:1. In this case, in the hole transporting doped layer 160, the mass ratio of the first hole transporting material to the second hole transporting material is 2:1.

Figure 14:
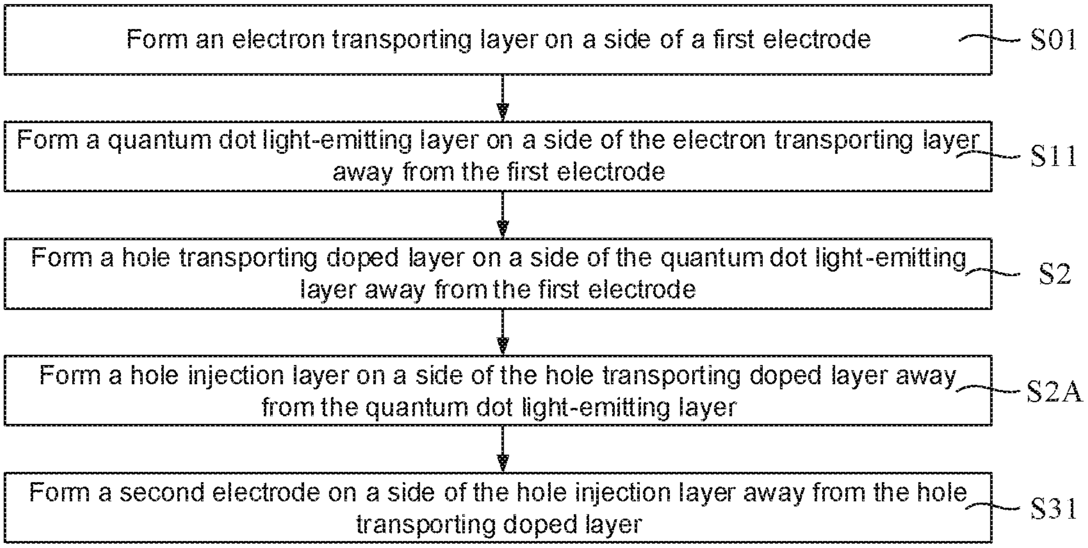
FIG. 14 is a flow diagram of another method of manufacturing a light-emitting device, in accordance with some embodiments.

FIG. 14 is a flow diagram of the method of manufacturing the light-emitting device, in accordance with some embodiments.

Referring to FIGS. 14 and 5, in some embodiments, before the step S1 of forming the quantum dot light-emitting layer 130 on the side of the first electrode 110, the method further includes a step S01 in which an electron transporting layer 180 is formed on the side of the first electrode 110.

In a case where the electron transporting layer 180 is a zinc oxide based nanoparticle film, zinc oxide nanoparticles may be spin coated, and heated at a temperature in a range from 80° C. to 120° C. to form the film. A rotational speed of a spin coater is set to be in a range from 500 rpm to 2500 rpm, so as to adjust a thickness of the film layer.

In a case where the electron transporting layer 180 is a zinc oxide film. During the zinc oxide film is formed, 1 g of zinc acetate (or zinc nitrate) is dissolved in 5 mL of a mixed solution of ethanolamine and 1-butanol to form a zinc precursor solution.

Then, the conductive glass is placed in a spin coater, and 90 μL to 120 μL of the zinc precursor solution is dripped onto the conductive glass to perform spin coating. Next, the conductive glass is placed on a heating stage at a temperature in a range from 250° C. to 300° C. to heat and evaporate the solvent.

The step S1 of forming the quantum dot light-emitting layer 130 on the side of the first electrode 110 includes a step S11 in which the quantum dot light-emitting layer 130 is formed on a side of the electron transporting layer 180 away from the first electrode 110.

In some embodiments, after the step S2 of forming the hole transporting doped layer 160 on the side of the quantum dot light-emitting layer 130 away from the first electrode 110, the method further includes a step S2A in which a hole injection layer 170 is formed on the side of the hole transporting doped layer 160 away from the quantum dot light-emitting layer 130.

The hole injection layer 170 may be formed by spin coating.

For example, the hole injection layer 170 may include PEDOT: PSS 4083. A film forming temperature of PEDOT is in a range from 130° C. to 150° C. A thickness of the hole injection layer 170 may be adjusted according to a rotational speed of a spin coater.

In addition, the hole injection layer 170 may be formed by evaporating.

In a case where the method includes the step S2A, the step S3 of forming the second electrode 120 on the side of the hole transporting doped layer 160 away from the quantum dot light-emitting layer 130 includes a step S31 in which the second electrode 120 is formed on a side of the hole injection layer 170 away from the hole transporting doped layer 160.

Figure 15:
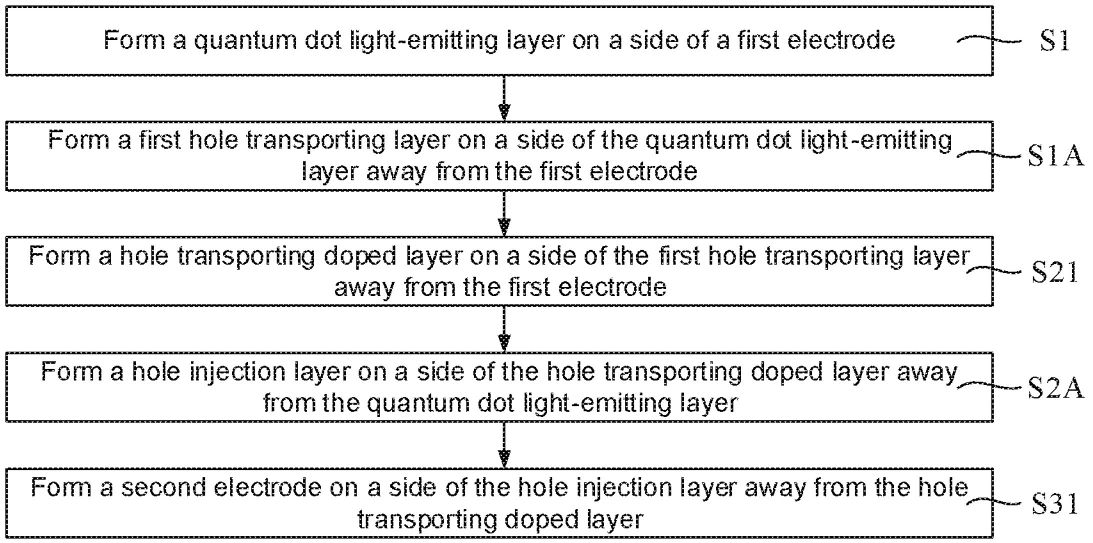
FIG. 15 is a flow diagram of yet another method of manufacturing a light-emitting device, in accordance with some embodiments.

FIG. 15 is a flow diagram of the method of manufacturing the light-emitting device, in accordance with some embodiments.

Referring to FIG. 15, in some embodiments, after the step S1 of forming the quantum dot light-emitting layer 130 on the side of the first electrode 110, the method further includes a step S1A in which a first hole transporting layer 140 is formed on the side of the quantum dot light-emitting layer 130 away from the first electrode 110.

For example, in the step S1A, the first hole transporting layer 140 may be evaporated, at a rate in a range from 0.1 Å/s to 0.5 Å/s, on the side of the quantum dot light-emitting layer 130 away from the first electrode 110.

The step S2 of forming the hole transporting doped layer 160 on the side of the quantum dot light-emitting layer 130 away from the first electrode 110 includes a step S21 in which the hole transporting doped layer 160 is formed on a side of the first hole transporting layer 140 away from the first electrode 110.

In a case where the light-emitting device 100 includes the first hole transporting layer 140 and the hole transporting doped layer 160, in the step S2, the ratio of the evaporation rate of the first hole transporting material to the evaporation rate of the second hole transporting material is 2:1. In this case, in the hole transporting doped layer 160, the mass ratio of the first hole transporting material to the second hole transporting material is 2:1.

Figure 16:
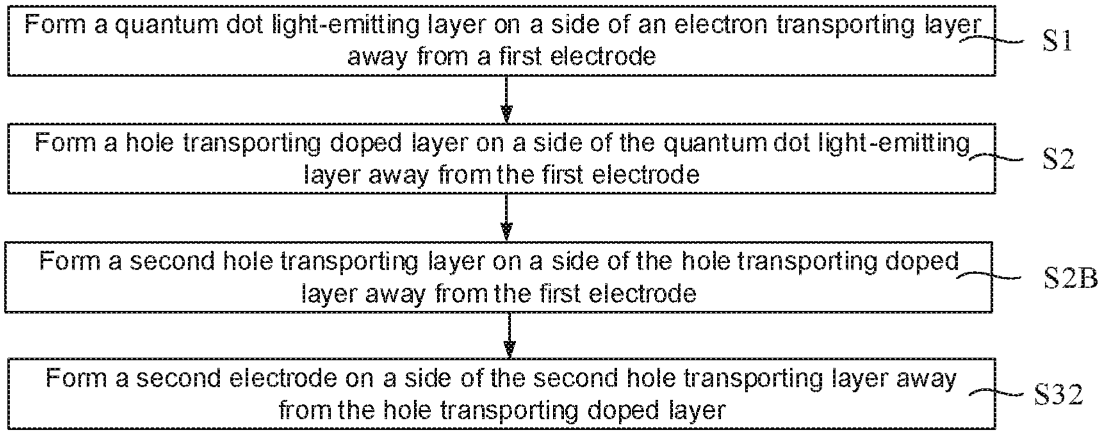
FIG. 16 is a flow diagram of yet another method of manufacturing a light-emitting device, in accordance with some embodiments.

FIG. 16 is a flow diagram of the method of manufacturing the light-emitting device, in accordance with some embodiments.

Referring to FIG. 16, in some embodiments, after the step S2 of forming the hole transporting doped layer 160 on the side of the quantum dot light-emitting layer 130 away from the first electrode 110, the method further includes a step S2B in which a second hole transporting layer 150 is formed on the side of the hole transporting doped layer 160 away from the first electrode 110.

For example, in the step S2B, the second hole transporting layer 150 may be evaporated, at a rate in a range from 0.1 Å/s to 1 Å/s, on the side of the quantum dot light-emitting layer 130 away from the first electrode 110.

In a case where the light-emitting device 100 includes the second hole transporting layer 150 and the hole transporting doped layer 160, in the step S2, the ratio of the evaporation rate of the first hole transporting material to the evaporation rate of the second hole transporting material is 1:1. In this case, in the hole transporting doped layer 160, the mass ratio of the first hole transporting material to the second hole transporting material is 1:1.

In a case where the light-emitting device 100 includes the first hole transporting layer 140, the second hole transporting layer 150 and the hole transporting doped layer 160, in the step S2, the ratio of the evaporation rate of the first hole transporting material to the evaporation rate of the second hole transporting material is 1:1. In this case, in the hole transporting doped layer 160, the mass ratio of the first hole transporting material to the second hole transporting material is 1:1.

It will be understood that in a case where the light-emitting device 100 further includes the hole injection layer 170, the hole injection layer 170 is located between the second hole transporting layer 150 and the second electrode 120.

The step S3 of forming the second electrode 120 on the side of the hole transporting doped layer 160 away from the quantum dot light-emitting layer 130 includes a step S32 in which the second electrode 120 is formed on a side of the second hole transporting layer 150 away from the hole transporting doped layer 160.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:

a first electrode and a second electrode;

a quantum dot light-emitting layer located between the first electrode and the second electrode; and a hole transporting doped layer located between the quantum dot light-emitting layer and the second electrode; wherein the hole transporting doped layer includes a mixture of at least two hole transporting materials, and highest occupied molecular orbital energy levels of the at least two hole transporting materials are different; wherein mobilities of the at least two hole transporting materials are different; of any two hole transporting materials, a mobility of a hole transporting material of which a highest occupied molecular orbital energy level is low is less than a mobility of a hole transporting material of which a highest occupied molecular orbital energy level is high;

the at least two hole transporting materials include a first hole transporting material and a second hole transporting material, and a highest occupied molecular orbital energy level of the first hole transporting material is less than a highest occupied molecular orbital energy level of the second hole transporting material; and the hole transporting doped layer includes a plurality of doped sub-layers that are arranged in a stack; of any two adjacent doped sub-layers, a mass ratio of the first hole transporting material to the second hole transporting material in a doped sub-layer proximate to the quantum dot light-emitting layer is greater than a mass ratio of the first hole transporting material to the second hole transporting material in a doped sub-layer away from the quantum dot light-emitting layer.

2. The light-emitting device according to claim 1, wherein in the hole transporting doped layer, a mass ratio of the first hole transporting material to the second hole transporting material is in a range from 1:5 to 5:1.

3. The light-emitting device according to claim 2, wherein in the hole transporting doped layer, the mass ratio of the first hole transporting material to the second hole transporting material is 2:1; or in the hole transporting doped layer, the mass ratio of the first hole transporting material to the second hole transporting material is 2:1; a thickness of the hole transporting doped layer is 0.66 to 5 times a thickness of the quantum dot light-emitting layer.

4. The light-emitting device according to claim 2, further comprising:

a first hole transporting layer located between the quantum dot light-emitting layer and the hole transporting doped layer; wherein a highest occupied molecular orbital energy level of the first hole transporting layer is less than or equal to the highest occupied molecular orbital energy level of the first hole transporting material, and is greater than a highest occupied molecular orbital energy level of the quantum dot light-emitting layer; and a mobility of the first hole transporting layer is less than or equal to a mobility of the first hole transporting material, and is greater than a mobility of the quantum dot light-emitting layer.

5. The light-emitting device according to claim 4, wherein the first hole transporting layer includes the first hole transporting material.

6. The light-emitting device according to claim 4, wherein in the hole transporting doped layer, the mass ratio of the first hole transporting material to the second hole transporting material is 2:1; or a thickness of the hole transporting doped layer is 0.33 to 5 times a thickness of the quantum dot light-emitting layer, and a thickness of the first hole transporting layer is 0.06 to 2 times the thickness of the hole transporting doped layer; or in the hole transporting doped layer, the mass ratio of the first hole transporting material to the second hole transporting material is 2:1; a thickness of the hole transporting doped layer is 0.33 to 5 times a thickness of the quantum dot light-emitting layer, and a thickness of the first hole transporting layer is 0.06 to 2 times the thickness of the hole transporting doped layer.

7. The light-emitting device according to claim 2, further comprising:

a second hole transporting layer located between the hole transporting doped layer and the second electrode; wherein a highest occupied molecular orbital energy level of the second hole transporting layer is less than a highest occupied molecular orbital energy level of the second electrode, and is greater than or equal to the highest occupied molecular orbital energy level of the second hole transporting material; and a mobility of the second hole transporting layer is less than a mobility of the second electrode, and is greater than or equal to a mobility of the second hole transporting material.

8. The light-emitting device according to claim 7, wherein the second hole transporting layer includes the second hole transporting material.

9. The light-emitting device according to claim 7, wherein in the hole transporting doped layer, the mass ratio of the first hole transporting material to the second hole transporting material is 1:1; or a thickness of the hole transporting doped layer is 0.1 to 2 times a thickness of the quantum dot light-emitting layer, and a thickness of the second hole transporting layer is 0.5 to 16.66 times the thickness of the hole transporting doped layer; or in the hole transporting doped layer, the mass ratio of the first hole transporting material to the second hole transporting material is 1:1; a thickness of the hole transporting doped layer is 0.1 to 2 times a thickness of the quantum dot light-emitting layer, and a thickness of the second hole transporting layer is 0.5 to 16.66 times the thickness of the hole transporting doped layer.

10. The light-emitting device according to claim 2, further comprising:

a first hole transporting layer located between the quantum dot light-emitting layer and the hole transporting doped layer; wherein a highest occupied molecular orbital energy level of the first hole transporting layer is less than or equal to the highest occupied molecular orbital energy level of the first hole transporting material, and is greater than a highest occupied molecular orbital energy level of the quantum dot light-emitting layer; a mobility of the first hole transporting layer is less than or equal to a mobility of the first hole transporting material, and is greater than a mobility of the quantum dot light-emitting layer; and a second hole transporting layer located between the hole transporting doped layer and the second electrode; wherein a highest occupied molecular orbital energy level of the second hole transporting layer is less than a highest occupied molecular orbital energy level of the second electrode, and is greater than or equal to the highest occupied molecular orbital energy level of the second hole transporting material; a mobility of the second hole transporting layer is less than a mobility of the second electrode, and is greater than or equal to a mobility of the second hole transporting material.

11. The light-emitting device according to claim 10, wherein the first hole transporting layer includes the first hole transporting material; and the second hole transporting layer includes the second hole transporting material.

12. The light-emitting device according to claim 10, wherein in the hole transporting doped layer, the mass ratio of the first hole transporting material to the second hole transporting material is 1:1; or a thickness of the hole transporting doped layer is 0.1 to 2 times a thickness of the quantum dot light-emitting layer, a thickness of the first hole transporting layer is 0.15 to 6.67 times the thickness of the hole transporting doped layer, and a thickness of the second hole transporting layer is 0.5 to 16.67 times the thickness of the hole transporting doped layer; or in the hole transporting doped layer, the mass ratio of the first hole transporting material to the second hole transporting material is 1:1; a thickness of the hole transporting doped layer is 0.1 to 2 times a thickness of the quantum dot light-emitting layer, a thickness of the first hole transporting layer is 0.15 to 6.67 times the thickness of the hole transporting doped layer, and a thickness of the second hole transporting layer is 0.5 to 16.67 times the thickness of the hole transporting doped layer.

13. The light-emitting device according to claim 2, wherein the highest occupied molecular orbital energy level of the first hole transporting material is 0.88 to 1.02 times a highest occupied molecular orbital energy level of the quantum dot light-emitting layer, and the highest occupied molecular orbital energy level of the second hole transporting material is 0.82 to 0.97 times the highest occupied molecular orbital energy level of the quantum dot light-emitting layer; or a mobility of the first hole transporting material is 1 to $10^3$ times a mobility of the quantum dot light-emitting layer, and a mobility of the second hole transporting material is $10^2$ to $10^4$ times the mobility of the quantum dot light-emitting layer; or the highest occupied molecular orbital energy level of the first hole transporting material is 0.88 to 1.02 times a highest occupied molecular orbital energy level of the quantum dot light-emitting layer, and the highest occupied molecular orbital energy level of the second hole transporting material is 0.82 to 0.97 times the highest occupied molecular orbital energy level of the quantum dot light-emitting layer; a mobility of the first hole transporting material is 1 to $10^3$ times a mobility of the quantum dot light-emitting layer, and a mobility of the second hole transporting material is $10^2$ to $10^4$ times the mobility of the quantum dot light-emitting layer.

14. The light-emitting device according to claim 1, wherein the at least two hole transporting materials include at least two of following materials: 4,4'-bis(carbazole-9-yl)biphenyl, 1,3-bis(carbazol-9-yl)benzene, 2,6-bis(3-(9H-carbazol-9-yl)phenyl)pyridine, 4,4',4"-tris(carbazol-9-yl)triphenylamine, 1,1-bis[4-[N,N'-di(p-tolyl)amino]phenyl]cyclohexane or N,N'-bis(naphthalen-1-yl)-N,N'-bis(phenyl)benzidine; or the light-emitting device further comprises: a hole injection layer located between the second electrode and the hole transporting doped layer, and an electron transporting layer located between the first electrode and the quantum dot light-emitting layer; or the at least two hole transporting materials include at least two of following materials: 4,4'-bis(carbazole-9-yl)biphenyl, 1,3-bis(carbazol-9-yl)benzene, 2,6-bis(3-(9H-carbazol-9-yl)phenyl)pyridine, 4,4',4"-tris(carbazol-9-yl)triphenylamine, 1,1-bis[4-[N,N'-di(p-tolyl)amino]phenyl]cyclohexane or N,N'-bis(naphthalen-1-yl)-N,N'-bis(phenyl)benzidine; and the light-emitting device further comprises: a hole injection layer located between the second electrode and the hole transporting doped layer, and an electron transporting layer located between the first electrode and the quantum dot light-emitting layer.

15. A display panel, comprising:

a substrate; and a plurality of light-emitting devices each according to claim 1; wherein the plurality of light-emitting devices are disposed on a side of the substrate.

16. A display apparatus, comprising: the display panel according to claim 15.

17. A method of manufacturing a light-emitting device, comprising:

forming a quantum dot light-emitting layer on a side of a first electrode;

forming a hole transporting doped layer on a side of the quantum dot light-emitting layer away from the first electrode; wherein the hole transporting doped layer includes a mixture of at least two hole transporting materials, and highest occupied molecular orbital energy levels of the at least two hole transporting materials are different; and forming a second electrode on a side of the hole transporting doped layer away from the quantum dot light-emitting layer; wherein the at least two hole transporting materials include a first hole transporting material and a second hole transporting material, and a highest occupied molecular orbital energy level of the first hole transporting material is less than a highest occupied molecular orbital energy level of the second hole transporting material; and the hole transporting doped layer includes a plurality of doped sub-layers that are arranged in a stack; of any two adjacent doped sub-layers, a mass ratio of the first hole transporting material to the second hole transporting material in a doped sub-layer proximate to the quantum dot light-emitting layer is greater than a mass ratio of the first hole transporting material to the second hole transporting material in a doped sub-layer away from the quantum dot light-emitting layer.

18. The method of manufacturing the light-emitting device according to claim 17, wherein in a step of forming the hole transporting doped layer on the side of the quantum dot light-emitting layer away from the first electrode, the first hole transporting material and the second hole transporting material are simultaneously deposited on the side of the first electrode by a dual-source co-evaporation method, so as to form the hole transporting doped layer.

* * * * *